(12) United States Patent
Gassaway et al.

(10) Patent No.: US 9,530,122 B1
(45) Date of Patent: Dec. 27, 2016

(54) PRODUCT DEFECT DIAGNOSTIC PROCESSING

(71) Applicant: Amazon Technologies, Inc., Reno, NV (US)

(72) Inventors: Cornell Tyrone Gassaway, Cupertino, CA (US); Andrei Smyk, Hayward, CA (US); Jack Lee Knutson, Shenzhen (CN)

(73) Assignee: Amazon Technologies, Inc., Reno, NV (US)

( * ) Notice: Subject to any disclaimer, the term of this patent is extended or adjusted under 35 U.S.C. 154(b) by 752 days.

(21) Appl. No.: 13/720,177

(22) Filed: Dec. 19, 2012

(51) Int. Cl.
*G21C 17/00* (2006.01)
*G06F 11/30* (2006.01)
*G01R 31/00* (2006.01)
*G01R 31/14* (2006.01)
*G06Q 10/00* (2012.01)

(52) U.S. Cl.
CPC ............. *G06Q 10/20* (2013.01); *G01R 31/002* (2013.01)

(58) Field of Classification Search
CPC ............................. G01R 31/002; G05B 23/02
USPC .......................................... 702/117, 184, 118
See application file for complete search history.

(56) References Cited

U.S. PATENT DOCUMENTS

| | | | | |
|---|---|---|---|---|
| 5,867,505 | A * | 2/1999 | Beffa | 714/718 |
| 6,154,712 | A * | 11/2000 | Breu | G01R 31/01 |
| | | | | 702/82 |
| 7,783,447 | B2 * | 8/2010 | Co et al. | 702/121 |
| 2001/0000649 | A1 * | 5/2001 | Fleury et al. | 324/765 |
| 2009/0085217 | A1 * | 4/2009 | Knickerbocker et al. | 257/774 |
| 2010/0244853 | A1 * | 9/2010 | Tong et al. | 324/537 |

* cited by examiner

*Primary Examiner* — Michael Nghiem
(74) *Attorney, Agent, or Firm* — Sutherland Asbill & Brennan LLP

(57) ABSTRACT

A device identifier associated with a device may be determined. A diagnostic processing identifier associated with diagnostic processing to be performed for the device may be identified or generated. In addition, a diagnostic processing route that designates an order in which the device is to be routed between one or more diagnostic stations for diagnostic processing may be determined. Diagnostic processing of the device may be conducted and information indicating results of the diagnostic processing may be received. The information may indicate one or more defects identified as part of the diagnostic processing. Additional processing, such as processing to determine whether a defective device is repairable, may be performed based at least in part on the results of the diagnostic processing.

15 Claims, 10 Drawing Sheets

PRODUCT DEFECT DIAGNOSTIC PROCESSING

BACKGROUND

Manufactured products that have been purchased may be returned to the original manufacturer or another entity such as a third party retailer of the products for a variety of reasons. For example, manufactured products may be returned upon sustaining damage, ceasing to function properly, and so forth. In addition, non-damaged and properly functioning products may be returned simply because they are no longer desired by the owner. Returned products may be subjected to various diagnostic tests to determine whether any defects are present prior to potentially offering the products for resale as refurbished products or as replacement products.

BRIEF DESCRIPTION OF THE DRAWINGS

The detailed description is set forth with reference to the accompanying drawings. In the drawings, the left-most digit(s) of a reference numeral identifies the drawing in which the reference numeral first appears. The use of the same reference numerals indicates similar or identical components; however, different reference numerals may be used to identify similar or identical components as well. Various embodiments may utilize element(s) and/or component(s) other than those illustrated in the drawings and some element(s) and/or component(s) may not be present in various embodiments. The use of singular terminology to describe a component or element may, depending on the context, encompass a plural number of such components or elements and vice versa.

DETAILED DESCRIPTION

Overview

Figure 1:
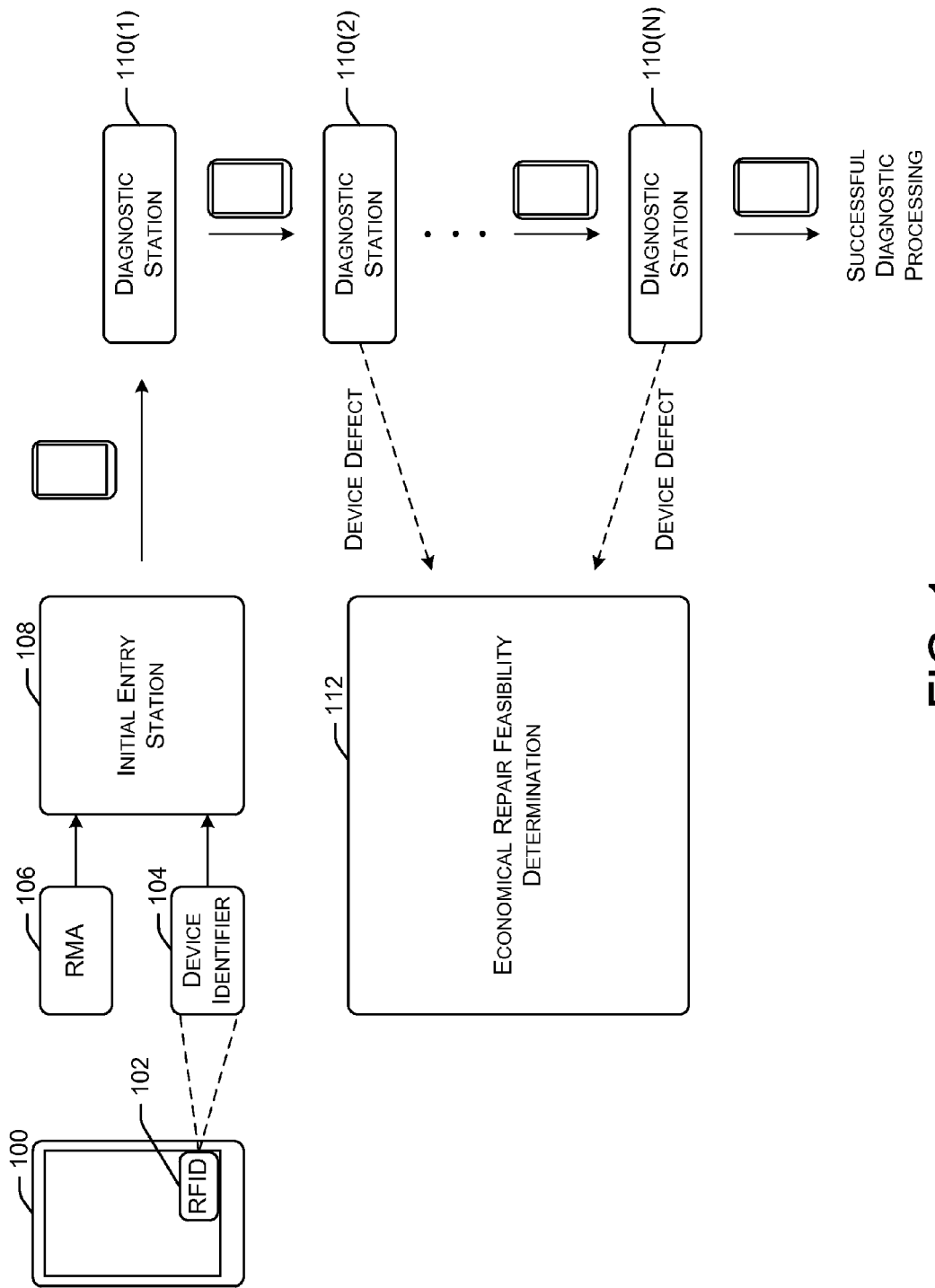
FIG. 1 is an abstracted hybrid process flow and system diagram that schematically depicts illustrative diagnostic processing in accordance with one or more embodiments of the disclosure.

This disclosure relates to, among other things, systems, methods, computer-readable media, techniques, and methodologies for facilitating diagnostic processing of a product to identify potential product defects and for making determinations as to the economic feasibility of repair upon identification of one or more product defects. A potentially defective product may be identified and an associated diagnostic processing route may be determined. The diagnostic processing route may be determined based on one or more characteristics associated with the product such as, for example, a product type, available information relating to potential defects that may be present in the product, historical information relating to previous diagnostic processing performed on the product, and so forth. The diagnostic processing route may specify a sequence of diagnostic stations through which the product is to be routed and various diagnostic assessments to be made along the route.

One or more computing devices may be provided at an initial entry station at a diagnostics facility at which a returned product is received. In addition, one or more computing devices may be provided at each of one or more diagnostic stations. The computing devices provided at the initial entry station and at the diagnostic stations may form at least part of a diagnostic processing system. One or more datastores may also be provided and may form part of the diagnostic processing system. The computing devices may be configured to access and/or retrieve information stored in the datastore(s) via one or more networks including, but not limited to, any one or a combination of different types of suitable communications networks, such as cable networks, the Internet, wireless networks, cellular networks, or any other private and/or public networks. Computing devices provided at different stations may also be configured to communicate with one another via the network(s).

The datastore(s) may store a variety of information including information relating to product identifiers of various sorts, information relating to diagnostic processing identifiers (which will be described in more detail later in this disclosure), information relating to diagnostic processing currently being performed on products, historical information relating to any previous diagnostic processing performed on products, a variety of reports and/or statistical data indicative of results of completed diagnostic processing, and so forth. It should be appreciated that the above examples of information that may be stored in the datastore(s) are merely illustrative and that any of a variety of types of information may be stored.

A product received at the initial entry station may be any product capable of being diagnosed, examined, and/or inspected to identify potential defects associated with the product. For example, the product may be any suitable electronic device including a mobile device such as a smartphone or other device with voice and/or data capabilities, a tablet device such as a mobile tablet device with voice and/or data capabilities, a personal digital assistant (PDA), a gaming console, a set-top box, a television, a device capable of recording or playing audio and/or video content, a printing device, a desktop computer, a laptop computer, a server device, or any other suitable device. While embodiments of the disclosure may be illustratively described herein in the context of electronic devices, it should be appreciated that such embodiments are equally applicable to any product capable of being diagnosed, examined and/or inspected to identify potential defects associated therewith.

Upon receipt of a product (e.g., an electronic device) at the initial entry station, various identifying information associated with the product may be gathered. As a non-limiting example, a device identifier such as a device serial number may be identified. In an illustrative scenario involving an electronic device, a Radio-Frequency Identification (RFID) tag or chip may be included in or affixed to the device. For example, during manufacture of the device, the RFID tag may be encoded with a serial number that uniquely identifies the particular device. An RFID reader may be provided at the initial entry station for interrogating the RFID tag and capturing the stored information indicative of the device serial number. In other embodiments, the device may be physically marked with a device identifier such as a device serial number. It should be appreciated that the above illustrative example is not limiting and that any suitable identifier capable of uniquely identifying a product may be identified via any suitable mechanism.

The computing device(s) provided at the initial entry station may store and execute an application that facilitates initiation and/or performance of various diagnostic processing in accordance with one or more embodiments of the disclosure. The application may include any combination of software, firmware, and/or hardware and may be referred to hereinafter as a "diagnostic processing application." The device identifier that uniquely identifies the device for which diagnostic processing is to be performed may be identified and stored using the diagnostic processing application. The RFID reader (or other data identification device) may be communicatively coupled to or may form part of the computing device(s) provided at the initial entry station. The encoded information captured by the RFID reader from the RFID tag associated with the device may be received by the diagnostic processing application. The diagnostic processing application may include computer-executable instructions for decoding the received information and identifying the device identifier. The decoded information indicative of the device identifier may then be stored in one or more shared datastore(s) and/or may be stored locally.

Information indicative of a particular return event associated with a particular device may also be identified or generated at the initial entry station. The information may include a diagnostic processing identifier that identifies a specific visit of a specific device to a diagnostic facility and may be used to track the device as it is routed through one or more diagnostic stations in accordance with the diagnostic processing route and the associated diagnostic processing performed on the device during that specific visit. In various embodiments, a new diagnostic processing identifier may be generated for each visit of a device to a diagnostic facility for diagnostic processing including, potentially, each visit of a same device. In certain embodiments, the diagnostic processing identifier may correspond to a return merchandise authorization (RMA) or return goods authorization (RGA) number. In various embodiments, the diagnostic processing identifier may be generated prior to receipt of the device at the initial entry station. For example, the diagnostic processing identifier (e.g., an RMA number) may be generated upon receipt of a customer request to have a product repaired or replaced under, for example, a warranty agreement. The diagnostic processing identifier (e.g., RMA number) may, in various embodiments, be identified from a machine-readable representation (e.g., a bar code) of the diagnostic processing identifier included, for example, on a shipping label that is used to send the device to a diagnostic facility.

In other embodiments, no diagnostic processing identifier may have been previously generated for a device prior to receipt of the device at the initial entry station or even if the diagnostic processing identifier was generated, no means for determining the diagnostic processing identifier may be included with the returned device. For example, although a diagnostic processing identifier may have been generated, a customer may have failed to use or include the representation of the identifier (e.g., the return shipping label) when returning the device. As another non-limiting example, a product sold at and returned to a physical retail environment may not have a diagnostic processing identifier generated prior to return of the product. In such embodiments, a diagnostic processing identifier may be generated at the initial entry station.

The diagnostic processing application may include computer-executable instructions for generating a diagnostic processing identifier and associating the generated identifier with a returned device. The diagnostic processing identifier may be generated according to any suitable algorithm such as, for example, by appending a time and date stamp to at least a portion of the device identifier. In other embodiments, the diagnostic processing identifier may represent a randomly generated alphanumeric identifier having a specified number of characters and/or character types. It should be appreciated that any suitable mechanism may be employed for generating the diagnostic processing identifier.

Upon identification of the device identifier as well as identification or generation of the diagnostic processing identifier and association of the diagnostic processing identifier with the device, a diagnostic processing route may be determined. The diagnostic processing route may be determined based on one or more characteristics associated with the device such as, for example, a device type, available information relating to potential defects that may be present in the device, historical information relating to previous diagnostic processing performed on the device, and so forth. As a non-limiting example, a prefix or some portion of the device identifier may be analyzed to determine a device type. The diagnostic processing route may then be determined based on the determined device type. Default diagnostic processing routes may differ from one type of device to another. In certain embodiments, a station operator may be permitted to select the diagnostic processing route from pre-defined options, modify a diagnostic processing route that is automatically determined by the diagnostic processing application, or independently create a diagnostic processing route. In other embodiments, the diagnostic processing application may automatically determine the diagnostic processing route based on one or more device characteristics without requiring user selection. In such embodiments, a station operator may or may not be permitted to modifying a diagnostic processing route that is automatically determined.

As previously described, a default diagnostic processing route may be associated with a device. In various embodiments, the default diagnostic processing route may be modified based on various information such as, for example, information relating to potential defects that may be present in the product, historical information relating to previous diagnostic processing performed on the product, and so forth. In addition, as will be described in more detail hereinafter, a diagnostic processing route may be modified dynamically during performance of the diagnostic processing based on, for example, the nature or type of device defects that are identified.

Upon determination of a diagnostic processing route for a device, the device may be sent to a first diagnostic station identified by the diagnostic processing route. Upon receipt of the device at the first diagnostic station, the device may be identified by, for example, capturing the device identifier using a data gathering device (e.g., an RFID reader) present at the first diagnostic station. In certain embodiments, such as those in which no RFID reader or other appropriate data gathering device for identifying the device identifier is present, the device identifier may be identified from a printed machine-readable representation of the device identifier that may have been generated, for example, at the initial entry station.

A diagnostic processing application may be accessible via one or more computing devices provided at the first diagnostic station. In various embodiments, the diagnostic processing application may be an instance of the same diagnostic processing application provided at the initial entry station. Further, in various embodiments, the diagnostic processing application may be a distributed application having "front-end" client-side portions accessible from each of the diagnostic stations and the initial entry station as well as "back-end" server-side portion(s) that may execute on one or more "back-end" server computers. The server-side portion(s) of the diagnostic processing application may process requests received from client-side portions including, for example, requests to read/write information from/to one or more datastores.

In various embodiments, diagnostic processing performed at the first diagnostic station may include visual, tactile, and/or auditory inspection of the device to identify any cosmetic or functional defects that may be present. For example, the device may be inspected to identify whether various types of physical damage to the device are present. As a non-limiting example, in the case of an electronic device such as a tablet or smartphone device, the device may be inspected to identify any screen damage, any damage to ports, whether buttons and switches are functioning properly, whether the display is functioning properly, whether there is any evidence of liquid damage, and so forth. The device may be visually inspected to identify potential defects at various levels of specificity or granularity. For example, if physical damage to the display screen is identified, the nature of the damage (e.g., spider-web crack, location of crack, etc.) may be identified.

Upon identification of one or more defects at the first diagnostic station, user input that is indicative of the identified defects may be provided to the diagnostic processing application by, for example, an operator at the station. As a non-limiting example, a station operator may indicate the current station at which the device is located by inputting a station identifier. Alternatively, the station identifier may be automatically determined by the diagnostic processing application based on a unique identifier (e.g., a Media Access Control (MAC) address) associated with a computing device provided at the station. In certain embodiments, various predefined defect types may be presented to the station operator by the diagnostic processing application based on the diagnostic station and the associated diagnostic processing performed at that station. The station operator may be provided with functionality that allows the operator to select from among the predefined defect types upon sensory identification of corresponding defects associated with the device. Alternatively or additionally, the station operator may be provided with functionality that allows the operator to provide free-form input indicative of identified defect(s). In various embodiments, an image capturing device may be used to generate an image or other visual profile of the device and defect(s) may be automatically identified based on the image or visual profile. Upon being provided with input indicative of identified defect(s), the diagnostic processing application may facilitate storage of information relating to the identified defect(s) in one or more datastore(s). For example, the client-side diagnostic processing application may transmit a request to a back-end server to store the information indicative of the identified defect(s) in the datastore(s). It should be appreciated that defects may be identified and information relating thereto may be stored in accordance with any suitable mechanism(s).

Upon identification of a defect and storage of information relating thereto, the defect may be classified or categorized according to one or more classifications. A defect may be appropriately classified based on a predefined association between a classification and the type of defect. In other scenarios, a station operator may be provided with the capability to select from a set of potential classifications for a particular defect. In still other scenarios, a classification may be dynamically generated based on the type of defect identified.

Depending on the classification associated with an identified defect, diagnostic processing may be halted or the device may be permitted to proceed along the diagnostic processing route for further diagnostic processing. For example, certain defect classifications may be indicative of defects that are significant or severe enough to halt the diagnostic processing and flag the product as having failed diagnostic processing thereby permitting a determination to be made as to whether repair of the identified defect(s) is economically feasible. Illustrative examples of such defects that may lead to a halting of the diagnostic processing and which may be identified at the first diagnostic station may include, for example, severe display screen damage, failure of the device to power on, and other types of defects that may prevent further diagnostic processing from being performed.

Other types of defect classifications may be indicative of defects that are not severe enough to halt the diagnostic processing (e.g., minor cosmetic defects) thereby permitting additional diagnostic processing to be performed on the device. The device may be later flagged as having failed diagnostic processing based on the initially identified defect or potentially based on additional defect(s) identified later along the diagnostic processing route. By not halting the diagnostic processing upon identification of a defect having a classification that does not meet an associated threshold, potentially more significant or severe defects may be identified as part of later diagnostic processing performed on the device. In certain embodiments, a station operator may make an independent determination as to whether a classification associated with a defect justifies halting the diagnostic processing and may provide an indication of such a determination to the diagnostic processing application. In other embodiments, the diagnostic processing application may automatically determine whether a defect's classification justifies halting the diagnostic processing based on one or more predefined algorithms and may provide an indication of that determination via, for example, a user interface associated with the diagnostic processing application.

Assuming that no defects are identified at the first diagnostic station or that any defects that are identified are not associated with defect classifications that justify halting the diagnostic processing, the device may be forwarded to one or more additional diagnostic stations. Upon receipt of the device at a subsequent diagnostic station in the diagnostic processing route, the device may be identified based on an associated device identifier in a manner similar to that described above. Various forms of additional diagnostic processing may be performed at subsequent diagnostic stations. For example, in scenarios involving electronic devices, various device functionality such as Wi-Fi functionality, Radio Frequency (RF) functionality, dedicated application functionality, and so forth may be tested and diagnosed. An indication of any functionality defects that are identified may be provided to the diagnostic processing application, and as described earlier, the identified defects may be classified. In various illustrative embodiments, functionality defects may be classified as "Manufacturer Induced Defects" or "MIDs" as such defects generally may not be customer induced. Various types of equipment may be used to test and diagnose device functionality and output generated by such equipment may be stored in one or more datastores. Various reports may be generated based on the stored information. For example, various statistical reports may be generated that may potentially identify trends in the output data indicative of recurring functionality defects or flaws for certain types of devices. Such statistical data may be provided to manufacturers to assist in improving device design to eliminate design flaws that may be causing recurring device functionality defects.

In a similar manner as described above in relation to customer induced defects, a determination may be made as to whether the diagnostic processing should be halted based on defect classifications associated with defects identified at subsequent diagnostic stations along the diagnostic processing route. If the defect classification associated with an identified defect indicates that the diagnostic processing should be halted, the device may be flagged as having failed diagnostic processing and a determination may be made as to whether repair of the identified defects is economically feasible as described above. If the defect classification does not indicate that the diagnostic processing should be halted, the device may be routed on through the diagnostic processing route to additional diagnostic stations until a defect is identified having a defect classification that halts the diagnostic processing or until the diagnostic processing is completed through the end of the diagnostic processing route.

If at least one defect has been identified upon completion of the diagnostic processing at each diagnostic station in the diagnostic processing route (or if the diagnostic processing was prematurely halted due to an identified defect), information indicating that the device has failed diagnostic processing may be stored in the datastore(s) in association with information relating to the identified defect(s). The above-described information may be further stored in association with information indicative of the device identifier and/or information indicative of the diagnostic processing identifier corresponding to the specific diagnostic processing during which the defect(s) are identified.

A determination may be made as to whether repair of the device is economically feasible. If repair is determined to be economically feasible, device repair processing may be initiated. On the other hand, if a determination is made that repair is not economically feasible, repair processing may not be initiated. For products that are determined not to be economically repairable, one or more components or parts of the product may be identified for re-use in connection with other product(s). The determination as to whether a defective product is economically repairable may be based on a variety of factors including the cost of the repair, the feasibility of repair (e.g., whether the damage catastrophic), any warranty coverage applicable to the product, the cost associated with providing a replacement product, and so forth. In certain embodiments, a determination with respect to the feasibility of repair may be overridden. For example, although an initial determination may be made that a device is beyond economical repair, the device may nonetheless be repaired if, for example, business considerations so dictate. Similarly, a decision not to repair a device may be made in certain embodiments despite a determination that economical repair of the device is feasible.

In certain embodiments, the diagnostic processing application may generate, and communicate to a printing device, instructions for generating a device failure label. The failure label may identify the defect(s) that were identified during the diagnostic processing, the associated defect classifications, and the determination that was made as to whether repair of the device is economically feasible. Further action may then be taken based on whether the device was determined to be economically repairable or beyond economical repair. In certain embodiments, repair of certain types of defects that were initially determined to be beyond economical repair may become economically feasible due to enhancements in repair capabilities.

In other embodiments, the device may proceed through the diagnostic processing without any defects in the device being identified. In such embodiments, the diagnostic processing application may generate, and communicate to a printing device, instructions to generate a diagnostic processing success label. The success label may indicate that no defects were identified during the diagnostic processing. In other embodiments, the success label may be a box label for a refurbished device that may be used as part of a resale of the refurbished device.

In various embodiments, the diagnostic processing application may facilitate re-routing of a returned device based on available information. For example, if information is available to the diagnostic processing application indicating that certain devices or device types are subject to a manufacturer's recall, when such devices are received at the initial entry station, they may be routed to the manufacturer for additional testing and analysis rather than being routed through a diagnostic processing route. Such devices may be identified based on associated device identifiers. The information indicating that certain devices should be routed to the manufacturer and not allowed to proceed through diagnostic processing may be accessed or received by the diagnostic processing application from one or more external systems that may be associated with the manufacturer.

In certain embodiments, a diagnostic processing route may be modified dynamically during the diagnostic processing. For example, a determination may be made to prematurely halt the diagnostic processing based on a cumulative effect of identified defects even if any individual defect is not sufficient to justify halting the diagnostic processing. Further, in various embodiments, a sequence of diagnostic stations designated by the diagnostic processing route may be modified based on identified defect(s). For example, if a particular type of defect is identified, it may be more efficient or otherwise appropriate for the device to be routed to a diagnostic station other than the next one specified by the existing diagnostic processing route.

In addition, in various embodiments, the diagnostic processing application may support functionality for providing an indication that a device is at an incorrect diagnostic station based on an identified diagnostic processing route. For example, when a device is received at a particular diagnostic station, the diagnostic processing application may receive information (e.g., a device identifier) based on which the received device may be identified. Further, the diagnostic processing application may receive information indicating the station at which the device is received (e.g., a station identifier). Such information may be received from, for example, a station operator. Alternatively, the station may be automatically identified by the diagnostic processing application. In addition, the diagnostic processing application may identify the diagnostic processing route designated for the device. The diagnostic processing application may make a determination as to whether the identified station corresponds to the correct diagnostic station based on the identified diagnostic processing route. If it is determined that the device is at the incorrect diagnostic station, the diagnostic processing application may provide an indication of such to the station operator as well as an indication of the correct diagnostic station to which the device is to be routed. If, however, the device is at the correct diagnostic station, diagnostic processing associated with the diagnostic station may be performed.

The embodiments described above as well as additional embodiments of the disclosure will be described in greater detail below through reference to the accompanying drawings.

Illustrative Architecture

Figure 2:
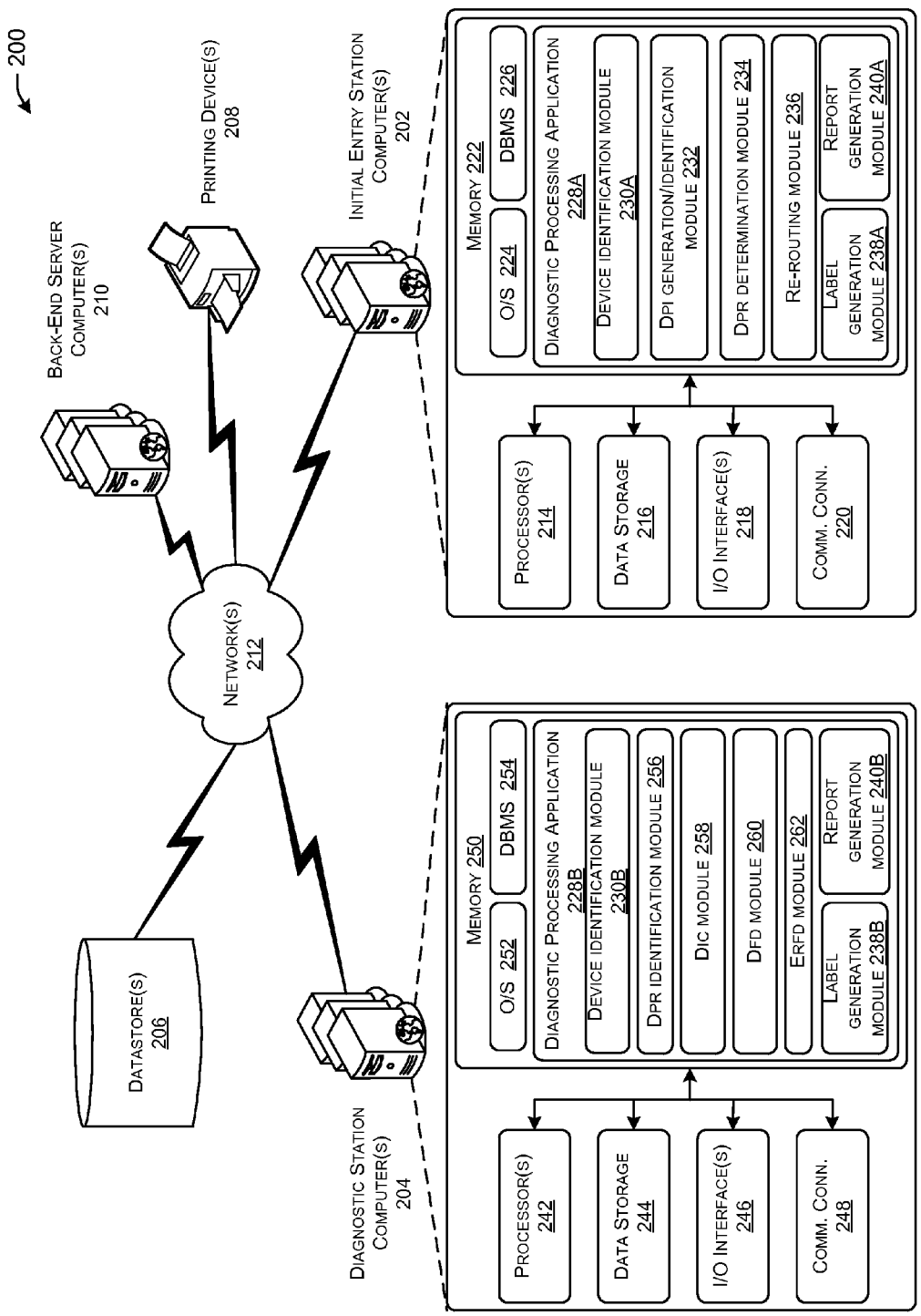
FIG. 2 schematically depicts an illustrative architecture for facilitating diagnostic processing in accordance with one or more embodiments of the disclosure.

FIG. 1 is an abstracted hybrid process flow and system diagram that schematically depicts illustrative diagnostic processing in accordance with one or more embodiments of the disclosure. FIG. 2 schematically depicts an illustrative architecture 200 for facilitating diagnostic processing in accordance with one or more embodiments of the disclosure. FIGS. 1 and 2 will be described hereinafter in conjunction with each other.

Referring to FIG. 1, an illustrative device 100 such as an electronic device is depicted. Although illustrative embodiments of the disclosure may be described in the context of diagnostic processing performed on the electronic device 100, it should be appreciated that this disclosure encompasses diagnostic processing performed on any suitable product. Referring to FIGS. 1 and 2, one or more initial entry station computers 202 may be provided in association with an initial entry station 108. In addition, one or more diagnostic station computers 204 may be provided in association with one or more diagnostic stations 110(1)-110(N). For example, in various embodiments, one or more diagnostic station computers 204 may be respectively provided at each of the one or more diagnostic stations 110(1)-110(N). In addition to the initial entry station computer(s) 202 and the diagnostic station computer(s) 204, the illustrative architecture 200 may further include one or more datastore(s) 206, one or more printing devices 208, and one or more back-end server computers 210. While the initial entry station computer(s) 202, the diagnostic station computer(s) 204, the datastore(s) 206, the printing device(s) 208, the back-end server computers 210 and/or the diagnostic station(s) 110(1)-110(N) may at times be referred to herein in the singular for the sake of convenience, it should be appreciated that a plural number of any of the aforementioned elements is encompassed by this disclosure as well. Further, any of the diagnostic station(s) 110(1)-110(N) may at times be generically referred to herein as diagnostic station 110.

The datastore(s) 206 may store a variety of information including information relating to device identifiers of various sorts, information relating to diagnostic processing identifiers, information relating to diagnostic processing currently being performed on devices, historical information relating to any previous diagnostic processing performed on devices, reports indicative of results of completed diagnostic processing, and so forth. It should be appreciated that the above examples of information that may be stored in the datastore(s) 206 are merely illustrative and that any of a variety of types of information may be stored.

Any one or more of the initial entry station computer 202, the diagnostic station computer 204, the datastore(s) 206, the printing device 208, and/or the back-end server computer 210 may be configured to communicate with any other one or more components of the architecture 200 via one or more networks 212. The network(s) 212 may include, but are not limited to, any one or a combination of different types of suitable communications networks, such as cable networks, the Internet, wireless networks, cellular networks, or any other private and/or public networks. Further, the network(s) 212 may include any type of medium over which network traffic may be carried including, but not limited to, coaxial cable, twisted wire pair, optical fiber, hybrid fiber coaxial (HFC), microwave terrestrial transceivers, radio frequency communications, satellite communications, or combinations thereof. In certain embodiments, the initial entry station computer 202 and/or the diagnostic station computer 204 may be configured to access the datastore(s) 206 via the network(s) 212 independently of the back-end server computer 210 in order to retrieve and/or store information in the datastore(s) 206. In other embodiments, the initial entry station computer 202 and/or the diagnostic station computer 204 may be provided with access to the datastore(s) 206 via the back-end server computer 210.

The initial entry station computer 202, the diagnostic station computer 204, and/or the back-end server computer 210 may include any suitable computing device including, but not limited to, a server computer, a mainframe computer, a desktop computer, a laptop computer, a mobile computing device, a personal digital assistant (PDA), and so forth. Each of the initial entry station computer 202 and the diagnostic station computer 204 is depicted as including various hardware and software components for facilitating initiation and/or performance of diagnostic processing in accordance with one or more embodiments of the disclosure. For example, the initial entry station computer 202 may include one or more processors 214 and one or more memories 222 (generically referred to herein as memory 222). The processor(s) 214 may include any suitable processing unit capable of accepting digital data as input, processing the input data based on stored computer-executable instructions, and generating output data. The computer-executable instructions may be stored, for example, in the at least one memory 222 and may include, for example, operating system software and application software. The processor(s) 214 may be configured to execute the computer-executable instructions to cause various operations to be performed. The processor(s) 214 may include any type of processing unit including, but not limited to, a central processing unit, a microprocessor, a Reduced Instruction Set Computer (RISC) microprocessor, a microcontroller, an Application Specific Integrated Circuit (ASIC), and so forth.

The memory 222 may store program instructions that are loadable and executable by the processor(s) 214 as well as data manipulated and/or generated by the processor(s) 214 during the execution of the program instructions. Depending on the configuration and implementation of the initial entry station computer 202, the memory 222 may be volatile memory (memory that is not configured to retain stored information when not supplied with power) such as random access memory (RAM) and/or non-volatile (memory that is configured to retain stored information even when not supplied with power) such as read-only memory (ROM), flash memory, and so forth. In various implementations, the memory 222 may include multiple different types of memory, such as static random access memory (SRAM), dynamic random access memory (DRAM), unalterable ROM, and/or writeable variants of ROM such as electrically erasable programmable read-only memory (EEPROM), flash memory, and so forth.

The initial entry station computer 202 may further include additional data storage 216 such as removable storage and/or non-removable storage including, but not limited to, magnetic storage, optical disk storage, and/or tape storage. Data storage 216 may provide storage of computer-executable instructions and other data. The data storage 216 may include storage that is internal and/or external to the initial entry station computer 202. The memory 222 and/or the data storage 216, removable and/or non-removable, are all examples of computer-readable storage media (CRSM).

The initial entry station computer 202 may further include communications connection(s) 220 that allow the initial entry station computer 202 to communicate with other computing devices or application software forming part of the networked architecture 200. For example, the initial entry station computer 202 may utilize the communications connection(s) 220 to communicate with the diagnostic station computer 204, the datastore(s) 206, the printing device 208, and/or the back-end server computer 210 via the network(s) 212.

The initial entry station computer 202 may additionally include input/output (I/O) interface(s) 218 (and optionally associated software components such as device drivers) that may support a various I/O devices, such as a keyboard, a mouse, a pen, a voice input device, a touch input device, a display, speakers, a camera, a microphone, a printer, a data acquisition device and so forth, for receiving user input and/or providing output to a user. The data acquisition device may include, for example, an RFID reader configured to interrogate an RFID tag provided in association with a returned device to capture encoded information stored on the RFID tag that may be indicative of a device identifier that uniquely identifies the device.

The memory 222 may include various program modules comprising computer-executable instructions that upon execution by the processor(s) 214 may cause the initial entry station computer 202 to perform various operations. For example, the memory 222 may have loaded therein an operating system (O/S) 224 that provides an interface between other application software executing on the initial entry station computer 202 and hardware resources of the initial entry station computer 202. More specifically, the O/S 224 may include a set of computer-executable instructions for managing hardware resources of the initial entry station computer 202 and for providing common services to other application programs (e.g., managing memory allocation among various application programs). The O/S 224 may include any operating system now known or which may be developed in the future including, but not limited to, a Microsoft Windows® operating system, an Apple OSX™ operating system, Linux, Unix, a mainframe operating system such as Z/OS, a mobile operating system, or any other proprietary or freely available operating system. The memory 224 may further include a database management system (DBMS) 226 for accessing, retrieving, storing, and/or manipulating data stored in one or more datastores (e.g., datastore(s) 206). The DBMS 226 may use any of a variety of database models (e.g., relational model, object model, etc.) and may support any of a variety of query languages.

The memory 222 may further include various program modules comprising computer-executable instructions that upon execution by the processor(s) 214 may cause the initial entry station computer 202 to perform various operations. For example, the memory 222 may have loaded therein a diagnostic processing application 228A. In various embodiments, the diagnostic processing application 228A loaded into the memory 222 of the initial entry station computer 202 may be a particular instance or installation of the application. Other instances of the application may be provided on other devices such as the diagnostic station computer 204. Further, in certain embodiments, the diagnostic processing application 228A may represent a client-side portion of the application that is configured to interact in a distributed fashion with a server-side portion of the application that may be provided, for example, in connection with the back-end server computer 210.

The diagnostic processing application 228A loaded into the memory of the 222 of the initial entry station computer 202 may further include various sub-modules that include computer-executable instructions for implementing various types of functionality. For example, the diagnostic processing application 228A may include a device identification module 230A, a diagnostic processing identifier (DPI) generation/identification module 232, a diagnostic processing route (DPR) determination module 234, a re-routing module 236, a label generation module 238A, and a report generation module 240A. Each of these sub-modules may include computer-executable instructions that, when executed by the processor(s) 214, configures the processor(s) 214 to cause various operations to be performed. The functionality supported by each of these sub-modules will be described in more detail hereinafter. It should be appreciated that each of the sub-modules depicted as forming part of the diagnostic processing application 228A may, in various embodiments, represent a logical partitioning of functionality supported by the application 228A. This logical partitioning is depicted for ease of explanation of the functionality supported and may not be representative of the structure of software or firmware that implements the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality.

Through continued reference to FIGS. 1 and 2, upon receipt of the device 100 at the initial entry station, various identifying information associated with the device 100 may be gathered. As a non-limiting example, a device identifier 104 such as a device serial number may be identified. In an illustrative scenario involving the device 100, an RFID tag or chip 102 may be included in or affixed to the device 100. For example, during manufacture of the device, the RFID tag 102 may be encoded with a serial number or other identifier that uniquely identifies the particular device. An RFID reader, which may be configured to communicate with the initial entry station computer 202 via one or more of the I/O interfaces 218, may be provided at the initial entry station 108. The RFID reader may be configured to interrogate the RFID tag 102 and capture the stored information indicative of the device identifier 104. The encoded information captured by the RFID reader from the RFID tag 102 associated with the device 100 may be communicated to and received by the diagnostic processing application 228A. Computer-executable instructions provided, for example, as part of device identification module 230A may be executed to decode the received information and identify the device identifier 104. The device identification module 230A may further include computer-executable instructions for storing or directing the storage of the decoded information indicative of the device identifier 104 in the datastore(s) 206 and/or in the data storage 216.

In certain embodiments, such as those in which no RFID reader for identifying the device identifier 104 from the RFID tag 102 associated with the device 100 is present at one or more of the diagnostic stations 110(1)-110(N), computer-executable instructions provided as part of the label generation module 238A may be executed to generate instructions to print or otherwise generate a machine-readable representation of the device identifier 104. The instructions may be communicated via the network(s) 212 to, for example, the printing device 208 to generate the label. The label that includes the machine-readable representation of the device identifier 104 may be used at subsequent diagnostic station(s) 110 that may not include RFID readers in order to identify the device 100.

The initial entry station computer 202 may further include the re-routing module 236. The re-routing module 236 may include computer-executable instructions for facilitating re-routing of the returned device 100 based on information that may be available in certain embodiments. For example, if information is available to the diagnostic processing application 228A indicating that certain devices or device types are subject to a manufacturer's recall, when such devices are received at the initial entry station 108, they may be routed to the manufacturer for additional testing and analysis rather than being routed in accordance with a diagnostic processing route. Such devices may be identified based on associated device identifiers. The information indicating that certain devices should be routed to the manufacturer and not allowed to proceed through the designated diagnostic processing may be accessed or received by the diagnostic processing application 228A from one or more external systems that may be associated with the manufacturer.

The initial entry station computer 202 may further include the report generation module 240A which may include computer-executable instructions for generating a variety of types of reports. For example, if the device 100 is subject to a manufacturer's recall as noted above, a corresponding report indicating that the device 100 was sent to the manufacturer or another entity for further testing and diagnosis may be generated.

In addition to identification of the device identifier 104, information indicative of a particular return event associated with the device 100 may also be identified or generated at the initial entry station 108. The information may include a diagnostic processing identifier 106 that identifies a specific visit of the device 100 to a diagnostic facility that includes at least a portion of the architecture 200 and may be used to track the device 100 through a sequence of diagnostic stations specified by a diagnostic processing route as well as associated diagnostic processing performed on the device 100 during that specific visit. In various embodiments, a new diagnostic processing identifier may be generated for each visit of a device to a diagnostic facility for diagnostic processing including, potentially, each visit of a same device. In certain embodiments, the diagnostic processing identifier 106 may correspond to a return merchandise authorization (RMA) or return goods authorization (RGA) number. In various embodiments, the diagnostic processing identifier 106 may be generated prior to receipt of the device 100 at the initial entry station 108. In such embodiments, the diagnostic processing identifier 106 may be identified, as an example, from a machine-readable representation (e.g., a bar code) of the diagnostic processing identifier 106 included, for example, on a shipping label that is used to send the device 100 to a diagnostic facility. As a non-limiting example, a bar code scanner or other data acquisition device may be used to read and capture information stored in a machine-readable representation of the diagnostic processing identifier. The bar code scanner may be configured to communicate the retrieved information to the initial entry station computer 202 via, for example, one or more of the I/O interfaces 218. The DPI generation/identification module 232 may include computer-executable instructions for facilitating receipt of the information from the bar code scanner, potentially decoding the information to identify the diagnostic processing identifier, and storing or directing storage of information indicative of the diagnostic processing identifier in the datastore(s) 206 and/or in the data storage 216.

In other embodiments, no diagnostic processing identifier may have been previously generated for the device 100 prior to receipt of the device 100 at the initial entry station 108 or even if the diagnostic processing identifier 106 was generated, no means for determining the diagnostic processing identifier 106 may be included with the returned device 100. In such embodiments, computer-executable instructions provided as part of, for example, the DPI generation/identification module 232 may be executed to generate the diagnostic processing identifier 106 and associate the generated identifier 106 with a returned device 100. The diagnostic processing identifier 106 may be generated according to any suitable algorithm such as, for example, by appending a time and date stamp to at least a portion of the device identifier 104. In other embodiments, the diagnostic processing identifier 106 may represent a randomly generated alphanumeric identifier having a specified number of characters and/or character types. It should be appreciated that any suitable mechanism may be employed for generating the diagnostic processing identifier 106.

Upon identification of the device identifier 104 as well as identification or generation of the diagnostic processing identifier 106 and association of the diagnostic processing identifier 106 with the device 100, a diagnostic processing route for the device may be determined. For example, computer-executable instructions provided as part of the DPR determination module 234 may be executed to determine or otherwise facilitate designation or identification of an appropriate diagnostic processing route for the device 100. The diagnostic processing route may be determined based on one or more characteristics associated with the device 100 such as, for example, a device type, available information relating to potential defects that may be present in the device, historical information relating to previous diagnostic processing performed on the device, and so forth. As a non-limiting example, a device type of the device 100 may be identified and the diagnostic processing route may then be determined or identified based on the determined device type. Default diagnostic processing routes may differ from one type of device to another. Further, in various embodiments, the default diagnostic processing route may be modified based on other information such as, for example, information relating to potential defects that may be present in the product, historical information relating to previous diagnostic processing performed on the product, and so forth. In addition, as described earlier and as will be described in more detail hereinafter, a diagnostic processing route may be modified dynamically during performance of the diagnostic processing based on, for example, the nature, type or number of defects that are identified during the route.

Upon determination of a diagnostic processing route for the device 100, the device may be forwarded in accordance with a sequence of one or more diagnostic stations 110 specified by the diagnostic processing route. One or more diagnostic station computers 204 may be provided at each of the diagnostic stations 110. An illustrative diagnostic station computer 204 may include one or more processors 242 and one or more memories 250 (generically referred to herein as memory 250). The processor(s) 242 may include any suitable processing unit capable of accepting digital data as input, processing the input data based on stored computer-executable instructions, and generating output data. The computer-executable instructions may be stored, for example, in the at least one memory 250 and may include, for example, operating system software and application software. The processor(s) 242 may be configured to execute the computer-executable instructions to cause various operations to be performed. The processor(s) 242 may include any type of processing unit including, but not limited to, a central processing unit, a microprocessor, a Reduced Instruction Set Computer (RISC) microprocessor, a microcontroller, an Application Specific Integrated Circuit (ASIC), and so forth.

The memory 250 may store program instructions that are loadable and executable by the processor(s) 242 as well as data manipulated and/or generated by the processor(s) 242 during the execution of the program instructions. Depending on the configuration and implementation of the diagnostic station computer 204, the memory 250 may be volatile memory (memory that is not configured to retain stored information when not supplied with power) such as random access memory (RAM) and/or non-volatile (memory that is configured to retain stored information even when not supplied with power) such as read-only memory (ROM), flash memory, and so forth. In various implementations, the memory 250 may include multiple different types of memory, such as static random access memory (SRAM), dynamic random access memory (DRAM), unalterable ROM, and/or writeable variants of ROM such as electrically erasable programmable read-only memory (EEPROM), flash memory, and so forth.

The diagnostic station computer 204 may further include additional data storage 244 such as removable storage and/or non-removable storage including, but not limited to, magnetic storage, optical disk storage, and/or tape storage. Data storage 244 may provide storage of computer-executable instructions and other data. The data storage 244 may include storage that is internal and/or external to the diagnostic station computer 204. The memory 250 and/or the data storage 244, removable and/or non-removable, are all examples of computer-readable storage media (CRSM).

The diagnostic station computer 204 may further include communications connection(s) 248 that allow the diagnostic station computer 204 to communicate with other computing devices or application software forming part of the networked architecture 200. For example, the diagnostic station computer 204 may utilize the communications connection(s) 248 to communicate with the initial entry station computer 202, the datastore(s) 206, the printing device 208, and/or the back-end server computer 210 via the network(s) 212.

The diagnostic station computer 204 may additionally include input/output (I/O) interface(s) 246 (and optionally associated software components such as device drivers) that may support a various I/O devices, such as a keyboard, a mouse, a pen, a voice input device, a touch input device, a display, speakers, a camera, a microphone, a printer, a data acquisition device and so forth, for receiving user input and/or providing output to a user. The data acquisition device may include, for example, an RFID reader configured to interrogate an RFID tag (e.g., the RFID tag 102) provided in association with a returned device (e.g., the device 100) to capture encoded information stored on the RFID tag that may be indicative of a device identifier (e.g., the device identifier 104) that uniquely identifies the device. The data acquisition device may also include a bar code scanner or any other suitable device.

The memory 250 may include various program modules comprising computer-executable instructions that upon execution by the processor(s) 242 may cause the diagnostic station computer 204 to perform various operations. For example, the memory 250 may have loaded therein an operating system (O/S) 252 that provides an interface between other application software executing on the diagnostic station computer 204 and hardware resources of the diagnostic station computer 204. More specifically, the O/S 252 may include a set of computer-executable instructions for managing hardware resources of the diagnostic station computer 204 and for providing common services to other application programs (e.g., managing memory allocation among various application programs). The O/S 252 may include any operating system now known or which may be developed in the future including, but not limited to, a Microsoft Windows® operating system, an Apple OSX™ operating system, Linux, Unix, a mainframe operating system such as Z/OS, a mobile operating system, or any other proprietary or freely available operating system. The memory 250 may further include a database management system (DBMS) 254 for accessing, retrieving, storing, and/or manipulating data stored in one or more datastores (e.g., datastore(s) 206). The DBMS 254 may use any of a variety of database models (e.g., relational model, object model, etc.) and may support any of a variety of query languages.

The memory 250 may further include various program modules comprising computer-executable instructions that upon execution by the processor(s) 242 may cause the diagnostic station computer 204 to perform various operations. For example, the memory 250 may have loaded therein a diagnostic processing application 228B. In various embodiments, the diagnostic processing application 228B loaded into the memory 250 of the diagnostic station computer 204 may be a particular instance or installation of the application. Other instances of the application (e.g., diagnostic processing application 228A) may be provided on other devices such as the initial entry station computer 204. Further, in certain embodiments, the diagnostic processing application 228B may represent a client-side portion of the application that is configured to interact in a distributed fashion with server-side portion(s) of the application that may be provided, for example, in connection with the back-end server computer 210.

The diagnostic processing application 228B loaded into the memory of the 250 of the diagnostic station computer 204 may further include various sub-modules that include computer-executable instructions for implementing various types of functionality. For example, the diagnostic processing application 228B may include a device identification module 230B, a diagnostic processing route (DPR) identification module 256, a defect identification/classification (DIC) module 258, a defect failure determination (DFD) module 260, an economical repair feasibility determination (ERFD) module 262, a label generation module 238B, and a report generation module 240B.

Each of these sub-modules may include computer-executable instructions that, when executed by the processor(s) 242, configures the processor(s) 242 to cause various operations to be performed. The functionality supported by each of these sub-modules will be described in more detail hereinafter. It should be appreciated that each of the sub-modules depicted as forming part of the diagnostic processing application 228B may, in various embodiments, represent a logical partitioning of functionality supported by the application 228B. This logical partitioning is depicted for ease of explanation of the functionality supported and may not be represented in the structure of the software or firmware that implements the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. In addition, while the diagnostic processing application 228A and the diagnostic processing application 228B are depicted as distinct applications executing on the initial entry station computer 202 and the diagnostic station computer 204, respectively, it should be appreciated that, in various embodiments, they may represent instances of a same application. Further, while each of the diagnostic processing application 228A and the diagnostic processing application 228B are depicted as including different modules that provide different functionality, it should be appreciated that the diagnostic processing application 228A and/or the diagnostic processing application 228B may include any of the modules and may support any of the associated functionality of modules depicted as being included in the other.

Referring again to FIG. 1 in conjunction with FIG. 2, upon receipt of the device 100 at a particular diagnostic station 110, the device 100 may be identified by, for example, capturing the device identifier 104 from the RFID tag 102 using an RFID reader provided at the diagnostic station 110. Computer-executable instructions provided as part of the device identification module 230B may be executed to facilitate i) receipt of encoded information captured by the RFID reader, ii) decoding of the received information to identify the device identifier 104, and iii) retrieval of stored information associated with the device identifier 104. The stored information may include, among other things, a description of the device, information relating to any defects that have been identified at previous diagnostic stations 100, information relating to any defect classifications associated with the identified defects, and so forth. In certain embodiments, such as those in which no RFID reader for identifying the device identifier 104 from the RFID tag 102 is present at a diagnostic station 110, the device identifier 104 may be identified from a label created at the initial entry station 108 that includes a printed machine-readable representation of the device identifier 104.

Upon identification of the device 100, computer-executable instructions provided as part of, for example, the DPR identification module 256 may be executed to determine the diagnostic processing route designated for the device 100. Upon determination of the diagnostic processing route, a station operator may be informed of the next diagnostic station 110 to route the device 100 to after diagnostic processing is performed at the current diagnostic station. In various embodiments, the diagnostic processing application may support functionality for providing an indication that a device is at an incorrect diagnostic station based on a determined diagnostic processing route. For example, when the device 100 is received at a particular diagnostic station 110, the device 100 may be identified based on the device identifier 104. In addition, the diagnostic processing route for the device 100 may be determined. Further, the diagnostic processing application 228B may receive information indicating the station at which the device 100 is received (e.g., a station identifier) from, for example, a station operator. Alternatively, the station may be automatically identified by the diagnostic processing application 228B. In addition, the diagnostic processing application 228B may determine the diagnostic processing route associated with the device. Computer-executable instructions provided as part of, for example, the DPR identification module 256 may be executed to enable a determination as to whether the identified station corresponds to the correct diagnostic station based on the diagnostic processing route. If it is determined that the device 100 is at the incorrect diagnostic station, the diagnostic processing application 228B (e.g., the DPR identification module 256) may provide an indication of such to the station operator as well as an indication of the correct diagnostic station to which the device 100 is to be routed. If, however, the device 100 is at the correct diagnostic station, diagnostic processing associated with the diagnostic station may be performed.

As previously discussed, in various embodiments, diagnostic processing performed at the first diagnostic station 110(1) may include various sensory inspection such as visual, tactile, and/or auditory inspection of the device 100 to identify cosmetic or functional defect(s) that may be present. The device may be inspected to identify potential defects at various levels of specificity or granularity. For example, if physical damage to the display screen is identified, the nature of the damage (e.g., spider-web crack, location of crack, etc.) may be identified.

Upon identification of one or more defects at the first diagnostic station 110(1), user input that is indicative of the identified defects may be provided to the diagnostic processing application 228B by, for example, an operator at the station via a user interface associated with the diagnostic processing application 228B. In certain embodiments, computer-executable instructions provided as part of, for example, the DIC module 258 may be executed to present various predefined selectable defect types to the station operator via a user interface associated with the diagnostic processing application 228B based on the diagnostic station (e.g., diagnostic station 110(1)) and the associated diagnostic processing performed at that station. Computer-executable instructions provided as part of, for example, the DIC module 258 may be executed to receive input from a station operator corresponding to defects identified as part of the diagnostic processing performed at the diagnostic station and to store or direct storage of information relating thereto in the datastore(s) 206 and/or locally in the data storage 244. Alternatively or additionally, computer-executable instructions provided as part of, for example, the DIC module 258 may be executed to support functionality that allows the operator to provide free-form input indicative of identified defect(s). In various embodiments, an imaging device (which may be communicatively coupled to the diagnostic station computer 204 via for example one or more of the I/O interfaces 246) may be used to generate an image or other visual profile of the device 100, and defect(s) may be identified based on the image or visual profile upon execution of computer-executable instructions provided, for example, as part of the DIC module 258.

Upon identification of a defect and storage of information relating thereto, computer-executable instructions provided, for example, as part of the DIC module 258 may be executed to facilitate classification or categorization of the identified defects according to one or more classifications. For example, the DIC module 258 may include computer-executable instructions for classifying a defect based on an association between a predefined classification and one or more types of defects. In other scenarios, computer-executable instructions provided as part of, for example, the DIC module 258 may be executed to provide a user interface by which an operator may select from a set of optional classifications for a particular defect. In still other scenarios, computer-executable instructions provided as part of, for example, the DIC module 258 may be executed to dynamically generate a defect classification based on the type of defect identified.

As previously discussed, depending on the classification associated with an identified defect, the diagnostic processing may be halted or the device 100 may be permitted to proceed in accordance with the diagnostic processing route for further diagnostic processing. For example, certain defect classifications may be indicative of defects that are significant or severe enough to halt the diagnostic processing and flag the product as having failed diagnostic processing thereby permitting a determination to be made as to whether repair of the identified defect(s) is economically feasible. Other types of defect classifications may be indicative of defects that are more cosmetic in nature and not severe enough to halt the diagnostic processing thereby permitting additional diagnostic processing to be performed on the device. The product may then be later flagged as having failed diagnostic processing based on the initially identified defect or potentially based on additional defect(s) identified at subsequent diagnostic stations along the diagnostic processing route.

In certain embodiments, a station operator may make an independent determination as to whether a defect classification associated with a defect justifies halting the diagnostic processing and may provide an indication of such a determination via a user interface provided by the diagnostic processing application 228B. In other embodiments, computer-executable instructions provided as part of, for example, the DFD module 260 may be executed to enable an automatic determination as to whether a defect's classification justifies halting the diagnostic processing.

Assuming that no defects are identified at the first diagnostic station 110(1) or that any defects that are identified are not associated with defect classifications that justify halting the diagnostic processing, the device 100 may be forwarded to one or more additional diagnostic stations 110(2)-110(N). Upon receipt of the device 100 at a subsequent diagnostic station in the diagnostic processing route, the device 100 may be identified based on the associated device identifier 104 in a manner similar to that described above. Various forms of additional diagnostic processing may be performed at subsequent diagnostic stations. For example, in scenarios involving electronic devices, various device functionality such as Wi-Fi functionality, RF functionality, dedicated application functionality, and so forth may be tested and diagnosed. Computer-executable instructions provided as part of, for example, the DIC module 258 may be executed to facilitate receipt of indications of any functionality defects that are identified, and as described earlier, to identify or generate defect classifications associated with the identified defects. Various types of equipment may be used to test and diagnose device functionality and output generated by such equipment may be stored in one or more datastores (e.g., the datastore(s) 206). Various reports may be generated based on the stored information upon execution of computer-executable instructions provided as part of, for example, the report generation module 240B. For example, various statistical reports may be generated that may potentially identify trends in the output data indicative of recurring functionality defects or flaws for certain types of devices, and these reports may be provided to manufacturers to assist in improving device design to eliminate design flaws that may be causing recurring device functionality defects.

In a similar manner as described above in relation to customer induced defects, a determination may be made as to whether the diagnostic processing should be halted based on defect classifications associated with defects identified at subsequent diagnostic stations along the diagnostic processing route. For example, a determination that the diagnostic processing should be halted based on identified defect(s) is schematically depicted in FIG. 1 using a dashed line that extends from diagnostic station 110(2). In such an illustrative scenario, the device 100 may be flagged as having failed diagnostic processing and a determination 112 may be made as to whether repair of the identified defects is economically feasible. If, on the other hand, the defect classification does not indicate that the diagnostic processing should be halted, the device may be routed on through to additional diagnostic stations specified by the diagnostic processing route (e.g., 110(3)-110(N)) until a defect is identified having a defect classification that halts the diagnostic processing or until the diagnostic processing has been performed at each station identified by the diagnostic processing route. Although FIG. 1 illustratively depicts halting of the diagnostic processing based on defects identified at diagnostic station 110(2), it should be appreciated that, if halted, the diagnostic processing may be halted at any diagnostic station 110 based on identified defect(s) having associated defect classification(s) that justify the halting of the processing.

If at least one defect has been identified after the diagnostic processing has been completed at each diagnostic station specified by the diagnostic processing route (or if the diagnostic processing was prematurely halted due to an identified defect having a defect classification indicating that the processing should be halted), information indicating that the device has failed diagnostic processing may be stored in the datastore(s) in association with information relating to the identified defect(s). For example, the diagnostic processing application 228B may store or direct storage of the above-described information in association with the device identifier 104 and the diagnostic processing identifier 106 that corresponds to the specific diagnostic processing during which the defect(s) are identified.

A second dashed line is schematically depicted in FIG. 1 as extending from the diagnostic station 110(N). In various embodiments, this may represent device failure at the completion of the diagnostic processing at the last diagnostic station specified by the diagnostic processing route based on defect(s) identified at prior diagnostic station(s). In other embodiments, this may represent identification of defect(s) at the diagnostic station 110(N). Upon identification of at least one defect during the diagnostic processing, a determination 112 may be made as to whether repair of the device 100 is economically feasible. The determination 112 may be made upon execution of computer-executable instructions provided as part of, for example, the ERFD module 262. The determination 112 may be based on a variety of factors including the cost of the repair, the feasibility of repair (e.g., whether the damage is catastrophic), any warranty coverage applicable to the product, the cost associated with providing a replacement product, and so forth. If, based on the determination 112, repair is determined to be economically feasible, device repair processing may be initiated. On the other hand, if the determination 112 is made that repair is not economically feasible, repair processing may not be initiated. For products that are determined not to be economically repairable, one or more components or parts of the product may be identified for re-use in connection with other product(s). In certain embodiments, a determination with respect to the feasibility of repair may be overridden. For example, although an initial determination may be made that a device is beyond economical repair, the device may nonetheless may be repaired if, for example, business considerations so dictate. Similarly, a decision not to repair a device may be made in certain embodiments despite a determination that economical repair of the device is feasible.

Upon identification of one or more device defects and designation of the device 100 as having failed diagnostic processing, computer-executable instructions provided as part of, for example, the label generation module 238B may be executed to generate instructions for generating a device failure label, which may then be communicated to the printing device 208. The failure label may identify the defect(s) that were identified during the diagnostic processing, the associated defect classifications, and the result of the determination 112 that was made as to whether repair of the device is economically feasible. Further action may then be taken based on whether the device was determined to be economically repairable or beyond economical repair. In certain embodiments, repair of certain types of defects that were initially determined to be beyond economical repair may become economically feasible due to enhancements in repair capabilities.

In other embodiments, the device 100 may proceed through the diagnostic processing route without any defects in the device being identified. In such embodiments, computer-executable instructions provided as part of, for example, the label generation module 238B may be executed to generate instructions for creating a diagnostic processing success label, which may then be communicated to the printing device 208. The success label may indicate that no defects were identified during the diagnostic processing. In other embodiments, the success label may be a box label for a refurbished device that may be used as part of a resale of the refurbished device.

It should be appreciated that the various hardware and software components depicted as forming part of the initial entry station computer(s) 202 and the diagnostic station computer(s) 204 are merely illustrative and that in some embodiments all depicted components may not be present while in other embodiments additional components may be present. Further, functionality described as being provided by a particular component may, in various embodiments, be provided by one or more other depicted components or by additional components not depicted. In addition, any of the depicted components may support additional functionality beyond that which has been described. Moreover, while various program modules have been depicted as being loaded in memory, it should be appreciated that functionality described as being supported or implemented by the program modules may be facilitated by any combination of hardware, software, and/or firmware.

While illustrative techniques and methodologies of the disclosure have been described through reference to FIG. 1 with respect to the illustrative architecture 200 of FIG. 2, it should be appreciated that numerous other configurations are possible for implementing the illustrative techniques and methodologies disclosed herein. Accordingly, embodiments of the disclosure are not limited to any particular architectural configuration.

Illustrative Processes

Figure 3:
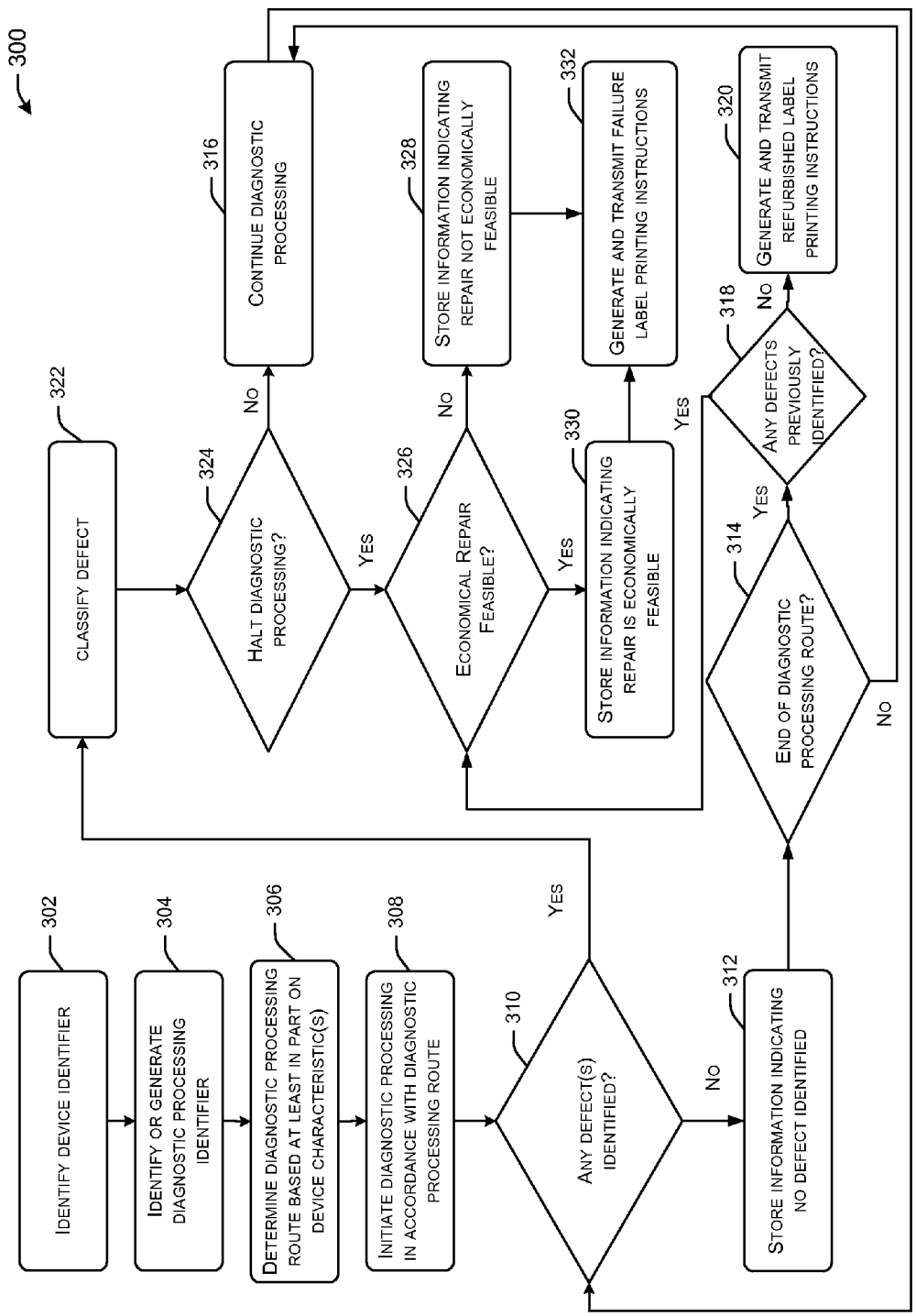
FIG. 3 is a process flow diagram depicting an illustrative method for facilitating diagnostic processing in accordance with one or more embodiments of the disclosure.

FIG. 3 is a process flow diagram depicting an illustrative method 300 for facilitating diagnostic processing in accordance with one or more embodiments of the disclosure. Various aspects of the illustrative method 300 may be facilitated, performed or functionality associated therewith supported by any of the components of the illustrative architecture 200 depicted in FIG. 2.

At block 302 of the illustrative method 300, a device identifier associated with a returned device may be identified and information indicative thereof may be stored. The device identifier may be identified according to any suitable methodology including any of the methodologies previously discussed.

At block 304, a diagnostic processing identifier may be identified or generated. In certain embodiments, the diagnostic processing identifier may be identifiable from a machine-readable representation thereof as previously described. In other embodiments, if no representation of the diagnostic processing identifier is provided in association with the device, one may be generated. Information indicative of the identified or generated diagnostic processing identifier may be stored in association with the device identifier. The diagnostic processing identifier may uniquely identify a particular receipt event of the device at a diagnostic facility and/or a particular instance of diagnostic processing performed on the device.

At block 306, a diagnostic processing route associated with the device may be identified, selected, designated and/or determined. As previously described, the diagnostic processing route may be determined based on one or more characteristics associated with the product such as, for example, a product type, available information relating to potential defects that may be present in the product, historical information relating to previous diagnostic processing performed on the product, and so forth. The diagnostic processing route may specify a sequence ordering of diagnostic stations through which the product is to be routed and various diagnostic assessments to be made at each diagnostic station along the route. In accordance with various embodiments of the disclosure, operations identified in blocks 302-306 may be performed by hardware, software, and/or firmware components associated with one or more initial entry station computers 202 provided at the initial entry station 108.

The operations depicted in blocks 308-330 may, in various embodiments, be performed, at least in part, by software, hardware and/or firmware associated with one or more diagnostic station computers 204. At block 308, diagnostic processing may be initiated in accordance with the diagnostic processing route. For example, when a device is received at a particular diagnostic station along the diagnostic processing route, the device may be identified based on the device identifier and various associated information may be accessed or retrieved such as information relating to the diagnostic processing route, information relating to any defects that have been identified along the route, and so forth.

At block 310, a determination may be made as to whether any device defects have been identified as part of diagnostic processing performed at a diagnostic station. For example, it may be determined that no defects have been identified as part of the diagnostic processing performed at the current diagnostic station based on input received by the diagnostic processing application 228B from a station operator. If such a determination is made, the method 300 may proceed to block 312 where information indicating that the device has passed the diagnostic processing performed at the current diagnostic station may be stored. Thereafter, a determination may be made at block 314 as to whether the current diagnostic station represents the last diagnostic station in the ordering of diagnostic stations specified by the diagnostic processing route. If the current station does not represent the end of the diagnostic processing route, the device may continue (block 316) to the next diagnostic station indicated by the diagnostic processing route.

On the other hand, if a determination is made at block 314 that the current diagnostic station does represent the last diagnostic station specified by the diagnostic processing route, the method 300 may proceed to determination block 318 where a determination may be made as to whether any device defects were previously identified at diagnostic stations earlier in the diagnostic processing route. If a determination is made that no device defects were previously identified, the method 300 may proceed to block 320 where instructions for printing a diagnostic processing success label may be generated and transmitted to a printing device. The success label may indicate that no defects were identified by diagnostic processing and may, in various embodiments, correspond to a refurbished label to be used in connection with resale of the device as a refurbished device. On the other hand, if a determination is made at block 318 that at least one defect was previously identified, the method 300 may proceed to block 326 where a determination may be made as to whether repair of the device is economically feasible.

Referring again to determination block 310, if a defect is identified during diagnostic processing performed at a current diagnostic station along the diagnostic processing route, the defect may be classified at block 322. Upon classification of the defect, the method 300 may proceed to decision block 324 where a determination may be made as to whether the diagnostic processing should be halted based on the classification associated with the defect. If it is determined that the diagnostic processing should not be halted, such as for example if the defect is a minor cosmetic defect that does not hinder the ability to perform additional diagnostic processing, the device may continue along the diagnostic processing route (block 316). As part of the continuation of the diagnostic processing, additional defects may be identified at the current diagnostic station and the determination of block 324 may be made with respect to these additional classified defects. On the other hand, if no other defects have been identified at the current diagnostic station, the device may be forwarded to the next diagnostic station specified by the diagnostic processing route.

Referring again to decision block 324, if a determination is made that the diagnostic processing should be halted based on the classification associated with the defect (e.g., the defect is so severe that further diagnostic processing is not possible), the method 300 may proceed to block 326 where, as noted earlier, a determination may be made as to whether repair of the device is economically feasible. If it is determined that repair of the device is economically feasible, information indicating the same may be stored at block 330. On the other hand, if it is determined that the device is beyond economical repair, information indicating the same may be stored at block 328. In the case of either determination, instructions for creating a failure label may be generated and transmitted at block 332 to, for example, a printing device. The printing device may generate the label based on the received instructions. The failure label may include information that identifies defect(s) associated with the device, classification(s) of the identified defect(s), and/or an indication of the assessment as to whether the device is beyond economical repair.

It should be noted that the type of defects that may be identified at block 318 may be those defects that were not severe enough to justify halting the diagnostic processing. That assessment may have been previously made at block 324. Alternatively, defects that are severe enough to justify halting the diagnostic processing may result in a positive determination at block 324. For either type of defect, a determination may be made at block 326 as to whether economical repair of the device is feasible. However, the timing of that determination may differ depending on whether the defect has an associated classification that justifies halting of the diagnostic processing or not.

Figure 4:
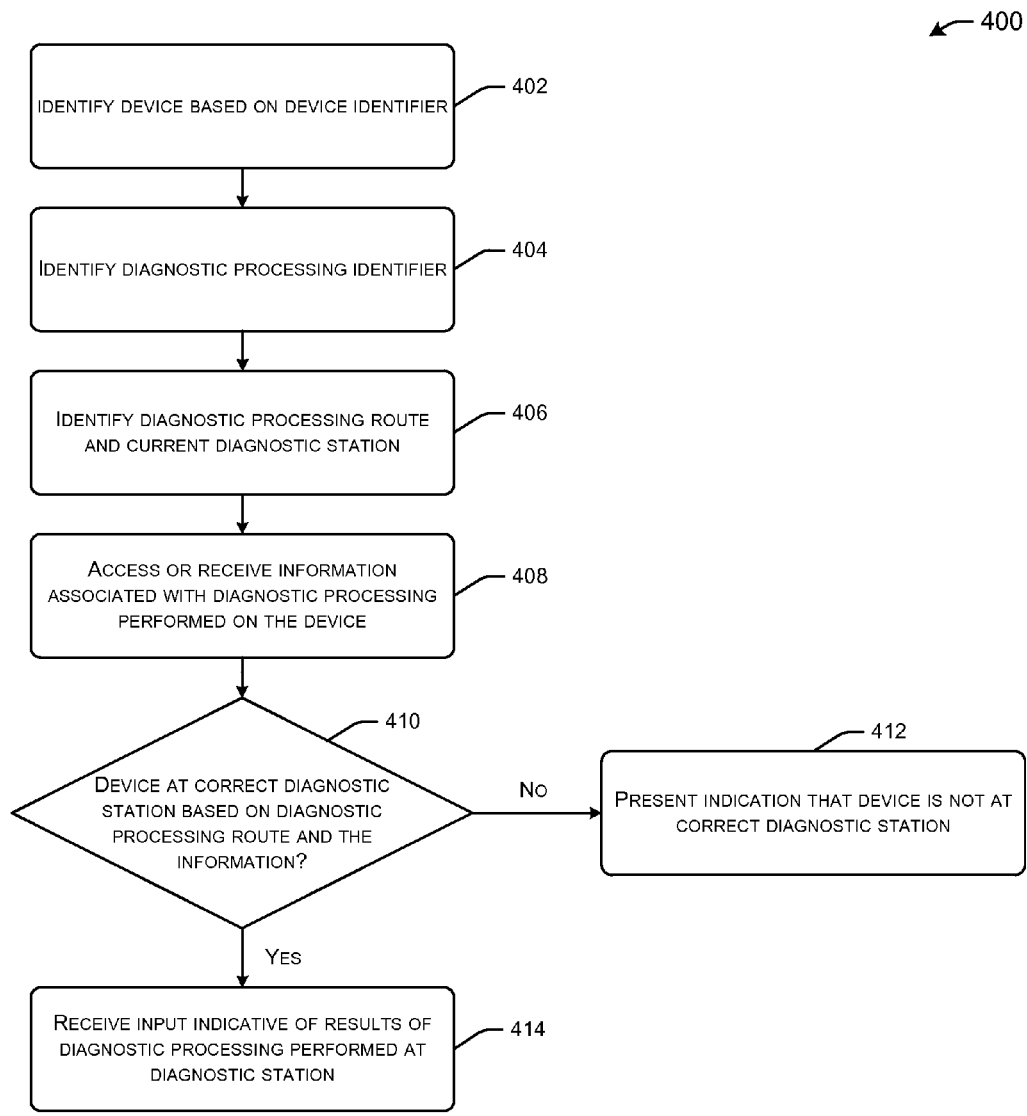
FIG. 4 is a process flow diagram depicting an illustrative method for identifying deviation from a diagnostic processing route in accordance with one or more embodiments of the disclosure.

FIG. 4 is a process flow diagram depicting an illustrative method 400 for identifying deviation from an ordering of diagnostic stations specified by a diagnostic processing route in accordance with one or more embodiments of the disclosure. In various embodiments, one or more of the operations of method 400 may be facilitated or performed by software, hardware and/or firmware associated with one or more diagnostic station computers 204.

At block 402, a device may be identified at a diagnostic station based on an associated device identifier. At block 404, a diagnostic processing identifier associated with a current visit of the device to the diagnostic facility may be identified. At block 406, a diagnostic processing route associated with the device may be determined. Further, at block 406 (or as a separate process operation), the current diagnostic station may be identified. At block 408, information associated with diagnostic processing performed on the device may be accessed or received. The information may indicate, for example, which diagnostic stations the device has already visited along the diagnostic processing route.

Upon the performance of the operations depicted in blocks 402-406, the method 400 may proceed to decision block 410 where a determination may be made as to whether the device is at the correct diagnostic station based on the diagnostic processing route and the information accessed or retrieved at block 408. For example, an appropriate diagnostic station for the device may be determined based on an analysis of the diagnostic processing route (which provides an indication of the sequence of diagnostic stations that the device should be forwarded to for performing diagnostic processing) and the information that indicates which diagnostic stations the device has already visited.

If it is determined at block 410 that the device is not at the correct diagnostic station, an indication of the same may be presented at block 412. The indication may be presented to a station operator at the current, incorrect diagnostic station via a user interface associated with the diagnostic processing application 228B. On the other hand, if it is determined that the device is at the correct diagnostic station, diagnostic processing may proceed at the current diagnostic station. More specifically, the method 400 may proceed to block 414 where input may be received by the diagnostic processing application 228 that is indicative of results of diagnostic processing performed at the current diagnostic station.

Figure 5:
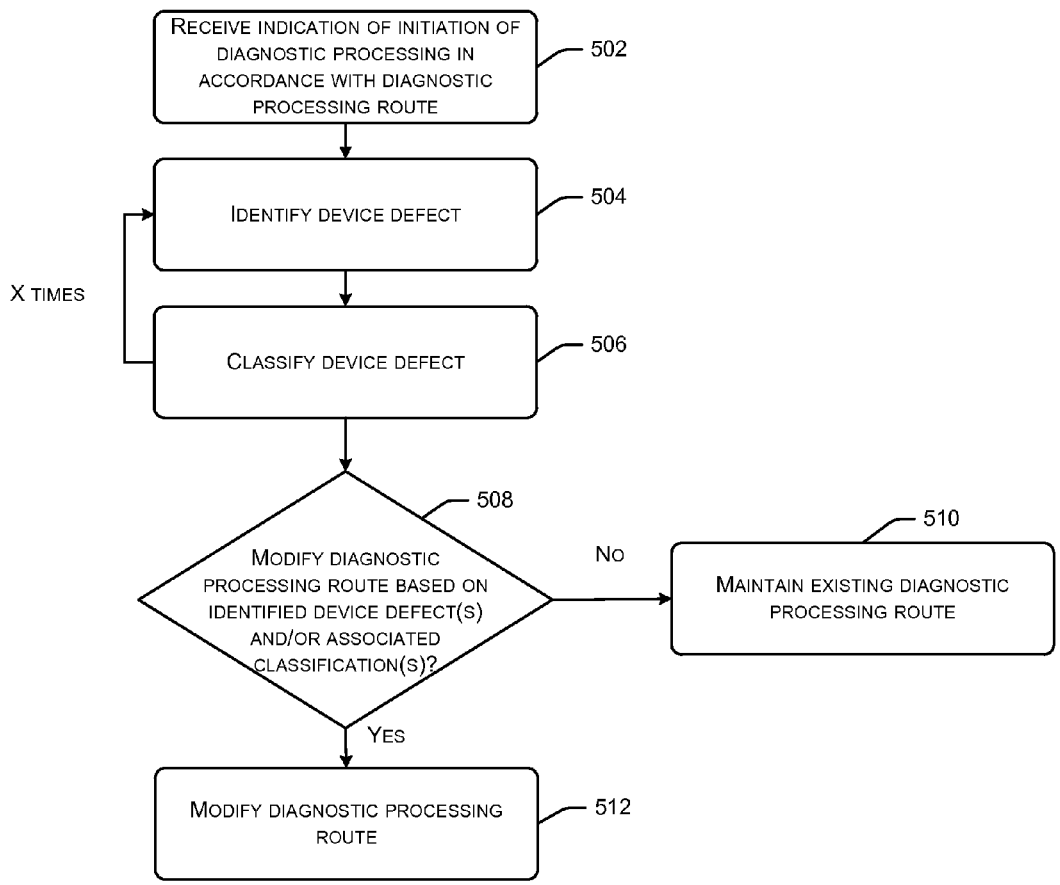
FIG. 5 is a process flow diagram depicting an illustrative method for potential modification of a diagnostic processing route based on defects identified during diagnostic processing in accordance with one or more embodiments of the disclosure.

FIG. 5 is a process flow diagram depicting an illustrative method 500 for potential modification of a diagnostic processing route based on defects identified during diagnostic processing in accordance with one or more embodiments of the disclosure.

At block 502, an indication of initiation of diagnostic processing in accordance with a diagnostic processing route may be received. For example, the indication may correspond to identification of a device identifier associated with a device upon receipt of the device at a diagnostic station. As another non-limiting example, the indication may correspond to identification of a diagnostic processing identifier, identification of a diagnostic processing route, and/or access or retrieval of information associated with diagnostic processing that has been performed on the device.

At block 504, a device defect may be identified. At block 506, the identified device defect may be classified. The operations depicted in blocks 504 and 506 may be performed any number of times across one or more diagnostic stations. At decision block 508, a determination may be made as to whether to modify an existing diagnostic processing route associated with the device based on the identified device defects and/or the classifications associated with the identified device defects. For example, a determination may be made as to whether to prematurely halt existing diagnostic processing based on a cumulative effect of identified defects even if any individual defect is not sufficient to justify halting of the diagnostic processing. Further, in various embodiments, a determination may be made as to whether a sequential ordering of diagnostic stations associated with an existing diagnostic route should be modified based on identified defect(s) and/or associated defect classifications. For example, if a particular type of defect is identified, it may be more efficient or otherwise appropriate for the device to be routed to a diagnostic station other than the next one specified by the existing diagnostic processing route. If it is determined at block 508 that the existing diagnostic processing route should not be modified, the route is maintained at block 510. On the other hand if it is determined at block 508 that the existing diagnostic processing route should be modified, the method 500 may proceed to block 512 and the diagnostic processing route may be accordingly modified.

Illustrative User Interfaces

FIGS. 6-10 schematically depict various illustrative user interfaces for facilitating or implementing various aspects of the methodologies and techniques described herein. The illustrative user interfaces may be described with respect to the illustrative architecture 200 depicted in FIG. 2. The user interfaces may be provided by, for example, the diagnostic processing application 228A and/or the diagnostic processing application 228B. It should be appreciated that the user interfaces depicted are merely illustrative and do not limit the information that may be presented or the manner of presentation of such information in accordance with embodiments of the disclosure. It should further be appreciated that while various user interfaces are depicted as permitting or requesting user input, in certain embodiments, various functionality supported by a diagnostic processing application may be fully automated, and thus, may not require user input. For example, in various embodiments, a user may be prohibited from selecting a station type, searching for a particular device identifier and/or diagnostic processing identifier, selecting or creating a diagnostic processing route, and so forth. Rather, in such embodiments, this functionality may be supported by the diagnostic processing application in an automated fashion without necessitating or permitting user input. Increased automation of various processes and functionality supported by the diagnostic processing application may minimize the impact of human error.

Figure 6:
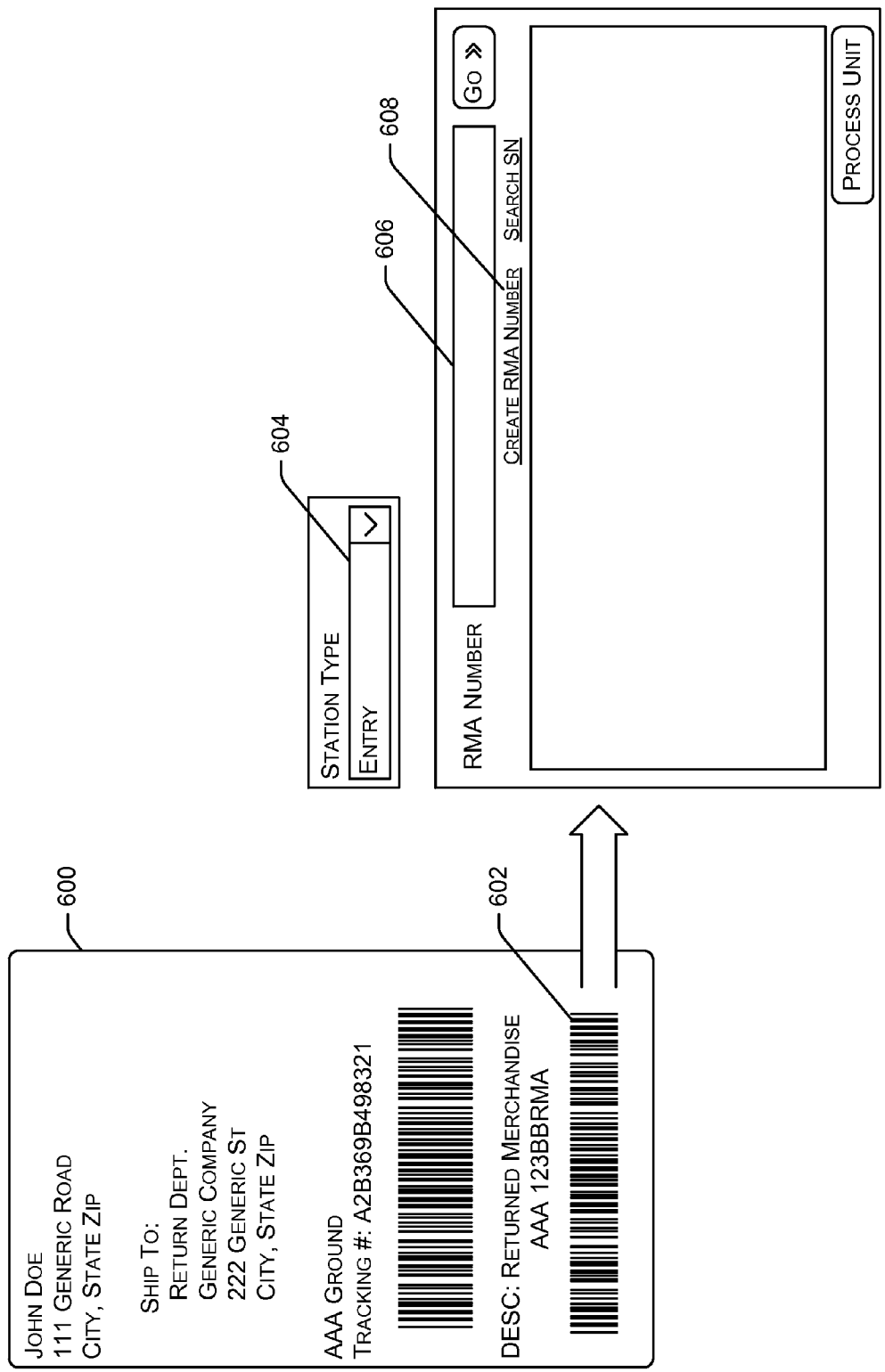
FIG. 6 is a schematic diagram depicting an illustrative representation of a diagnostic processing identifier and an illustrative diagnostic processing application user interface for facilitating identification of the diagnostic processing identifier in accordance with one or more embodiments of the disclosure.

FIG. 6 is a schematic diagram depicting an illustrative representation of a diagnostic processing identifier and an illustrative diagnostic processing application user interface for receiving the diagnostic processing identifier as input in accordance with one or more embodiments of the disclosure. Element 600 may, in various embodiments, represent a shipping label or any other suitable physical medium. Element 600 may include a machine-readable representation 602 of a diagnostic processing identifier. The information encoded in the machine-readable representation 602 may be read by, for example, a bar code scanner provided at the initial entry station 108 and received by the diagnostic processing application 228A as a result of a communicative coupling of the bar code scanner to the initial entry station computer 202 running the diagnostic processing application 228A. The information encoded in the representation 602 may be decoded and the diagnostic processing identifier may be identified. The diagnostic processing identifier may be automatically populated in field 606 of a user interface that may be provided by the diagnostic processing application 228A. Alternatively, a station operator may manually input the diagnostic processing identifier into the field 606. The user interface may also provide a station operator with a capability to select the station type as the initial entry station 108 from a group of predetermined stations. However, as noted above, the station type may be determined automatically without user input. In those embodiments in which no diagnostic processing identifier has been previously created or no physical medium 600 from which the identifier is ascertainable is available, the diagnostic processing application 228A may support functionality for generating a diagnostic processing identifier. For example, a selectable widget 608 may be provided that upon selection may direct a user to additional user interface(s) for generating the diagnostic processing identifier.

Figure 7A:
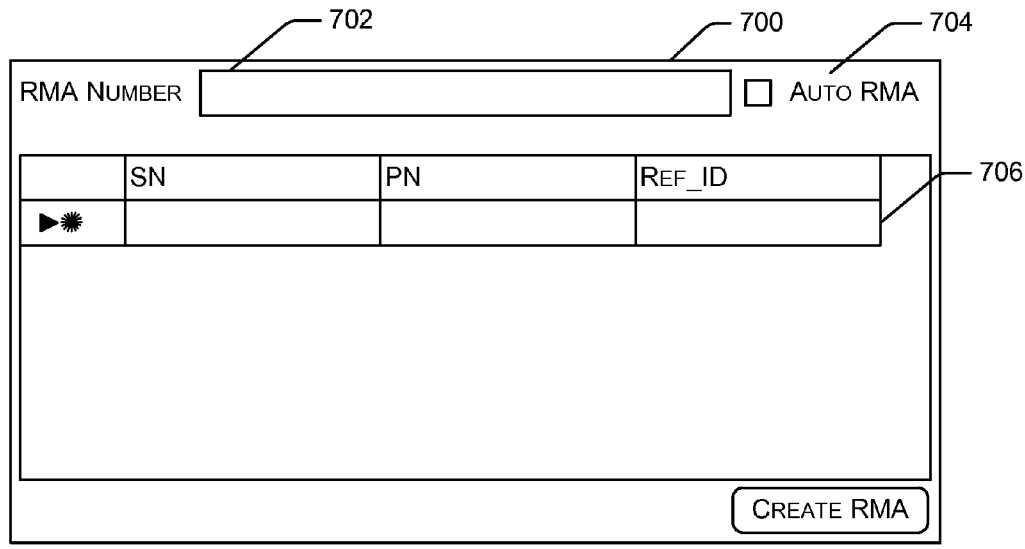
FIG. 7A depicts an illustrative diagnostic processing application user interface for generating a diagnostic processing identifier in accordance with one or more embodiments of the disclosure.
Figure 7B:
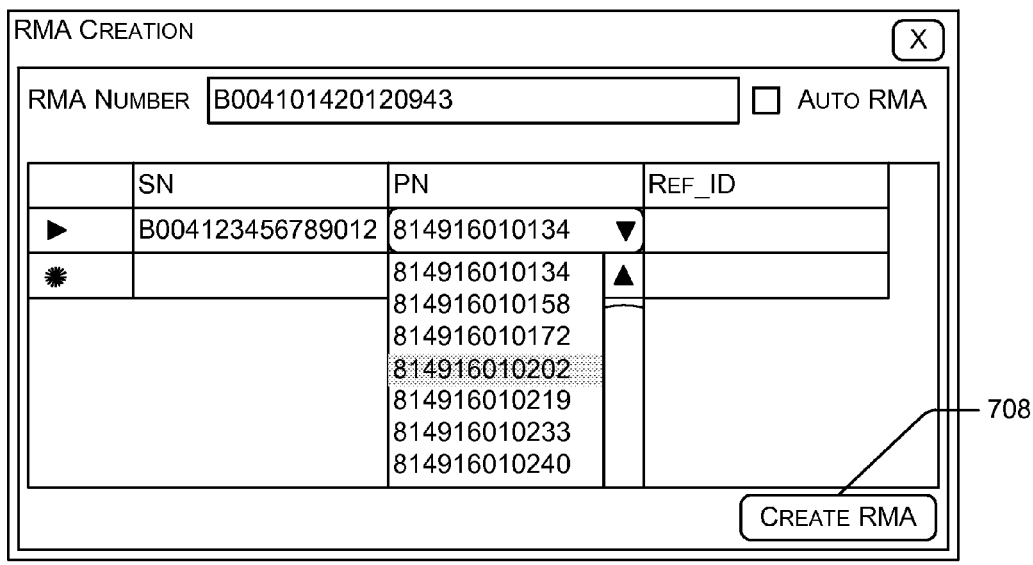
FIG. 7B depicts generation of a diagnostic processing identifier using the illustrative user interface of FIG. 7A in accordance with one or more embodiments of the disclosure.

FIG. 7A depicts an illustrative diagnostic processing application user interface 700 for generating a diagnostic processing identifier in accordance with one or more embodiments of the disclosure. FIG. 7B depicts generation of a diagnostic processing identifier using the illustrative user interface 700 of FIG. 7A in accordance with one or more embodiments of the disclosure.

The illustrative user interface 700 may include a field 700 in which a diagnostic processing identifier 702 may be populated. The user interface 700 may further provide a capability for a user to indicate a desire to generate a diagnostic processing identifier. For example, a selectable widget 704 may be provided that upon selection may cause computer-executable instructions provided as part of, for example, the DPI generation/identification module 232 to be executed to generate a diagnostic processing identifier. The generated diagnostic processing identifier may become populated in the field 702. In addition, various fields 706 may be provided for inputting or otherwise identifying various device identifiers such that the device identifiers are stored in association with the generated diagnostic processing identifier. A selectable widget 708 may be provided that upon selection completes the diagnostic processing identifier generation process.

Figure 8:
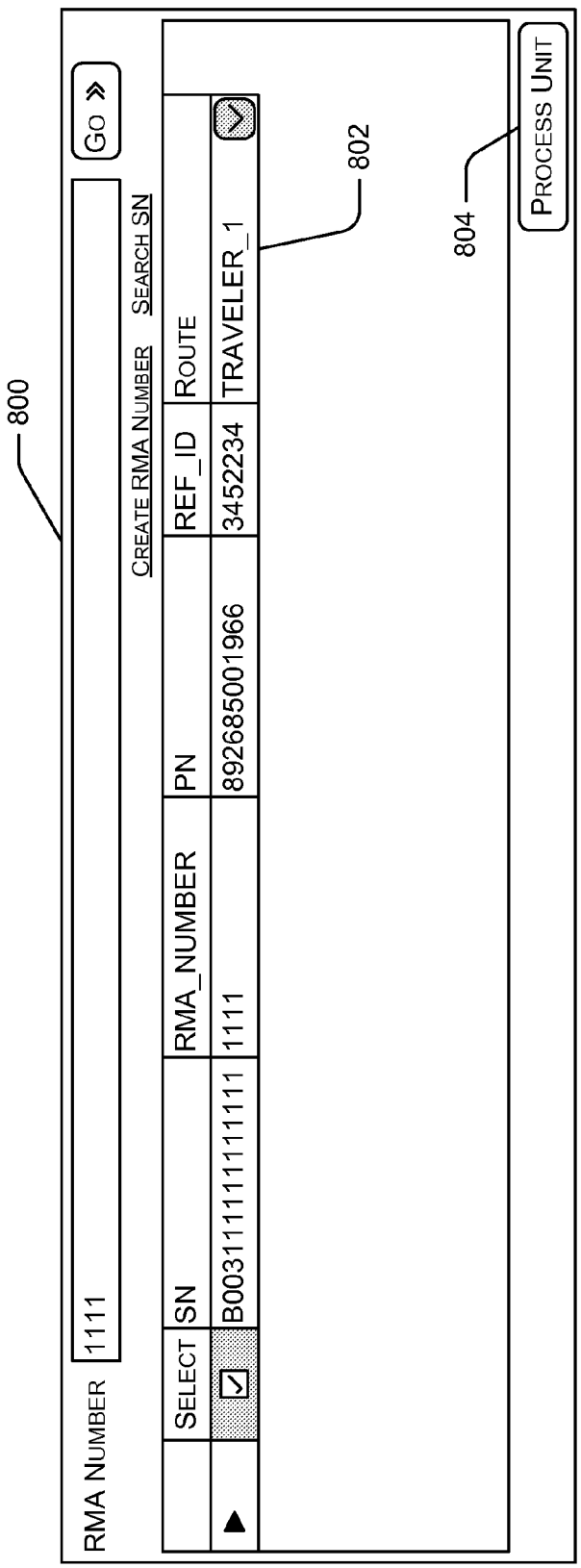
FIG. 8 depicts an illustrative diagnostic processing application user interface for determining a diagnostic processing route in accordance with one or more embodiments of the disclosure.

FIG. 8 depicts an illustrative diagnostic processing application user interface 800 for selecting, designating or identifying a diagnostic processing route in accordance with one or more embodiments of the disclosure. The user interface 800 may include a drop-down menu from which an appropriate diagnostic processing route may be selected. In certain embodiments, a default diagnostic processing route may be identified based on, among other things, one or more characteristics associated with the device and the user may be able to select a route other than the default route. In other embodiments, a user may be provided with the capability to provide free-form input indicative of the desired diagnostic processing route such as by specifying a sequence of diagnostic stations included in the route. The user may direct the diagnostic processing application 228A to facilitate initiation of diagnostic processing in accordance with the selected diagnostic processing route by selecting the selectable widget 804. In certain other embodiments, the diagnostic processing application 228A may automatically determine a diagnostic processing route and a station operator may be prohibited from altering the determined route. In various embodiments, an automatically determined route may be modified or an alternative route may be selected by an operator having appropriate credentials to make such changes.

Figure 9:
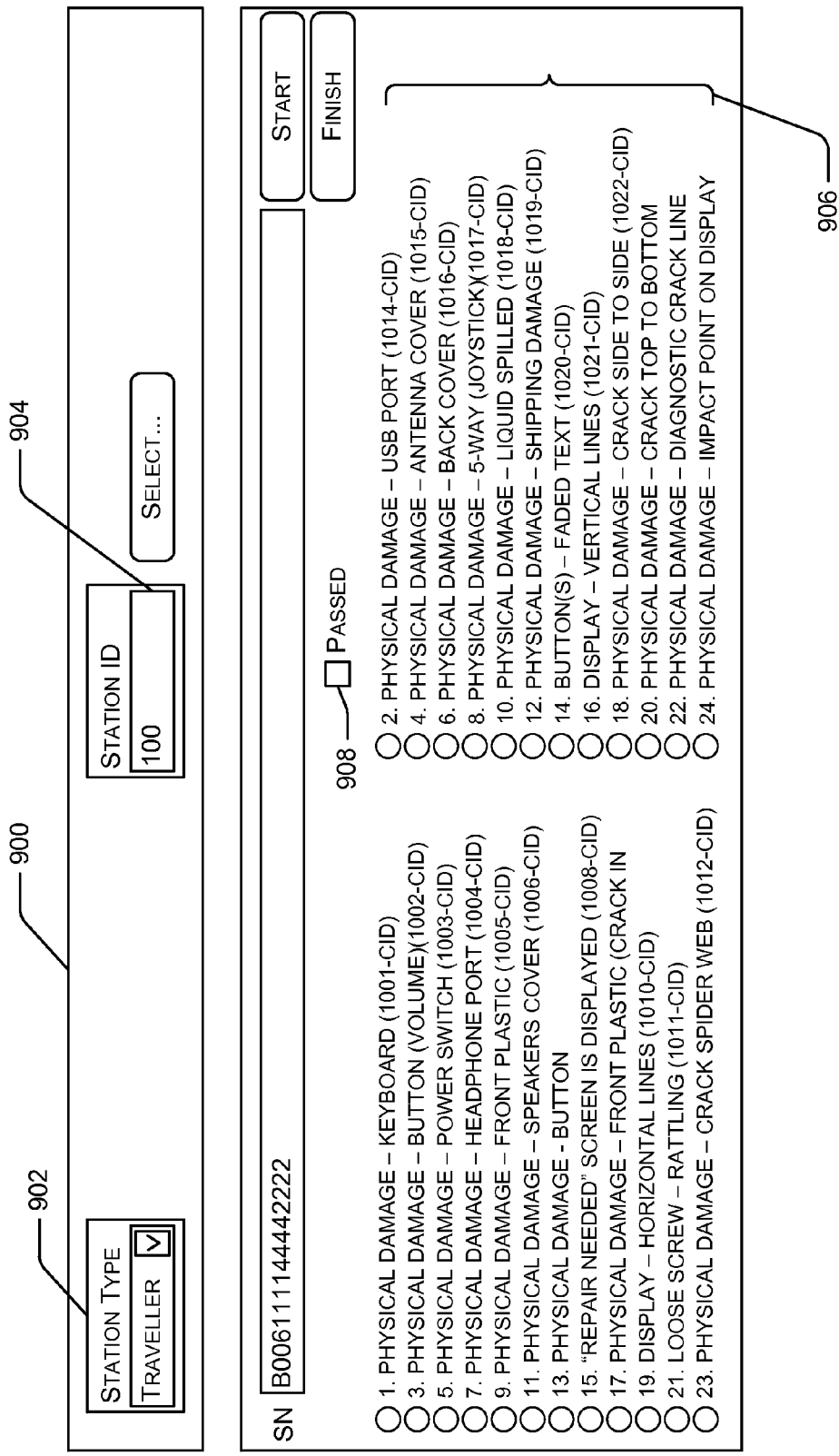
FIG. 9 depicts an illustrative diagnostic processing application user interface for identifying device defects as part of diagnostic processing performed at a diagnostic station in accordance with one or more embodiments of the disclosure.

FIG. 9 depicts an illustrative diagnostic processing application user interface 900 for identifying device defects as part of diagnostic processing performed at a diagnostic station in accordance with one or more embodiments of the disclosure. The user interface 900 may further provide a user with the capability to indicate a current diagnostic station at which the device is located by, for example, inputting a station identifier into field 904, selecting the station identifier from a drop-down menu, and so forth. In other embodiments, the current diagnostic station may be determined automatically without user input. The user interface 900 may also provide an indication 902 of the type of diagnostic processing performed at the diagnostic station. The user interface 900 may further include a presentation 906 of the types of defects that may be identified based on the diagnostic processing performed at the diagnostic station.

For example, the illustrative types of defects shown in FIG. 9 may be identifiable as part of the diagnostic processing performed at the first diagnostic station 110(1) (FIG. 1). Any defects identified may be selected from the defect options presented, and upon selection, the diagnostic processing application 228A may store information relating to the identified defects. If no defects are identified, or defects that are identified are not severe enough to halt the diagnostic processing, the station operator may indicate that the device has passed diagnostic processing at the diagnostic station via selection of the widget 908. Even though a device may be indicated as having passed diagnostic processing at a particular station, if defects are identified, the device may be failed upon completion of the diagnostic processing at each diagnostic station along the diagnostic processing route. It should be appreciated that the particular presentation of information depicted in FIG. 9 is not limiting and that any suitable information may be presented in any suitable manner. For example, the user interface 900 may present categories of defects and drill-down functionality that allows a station operator to specify defects with varying levels of granularity.

Figure 10:
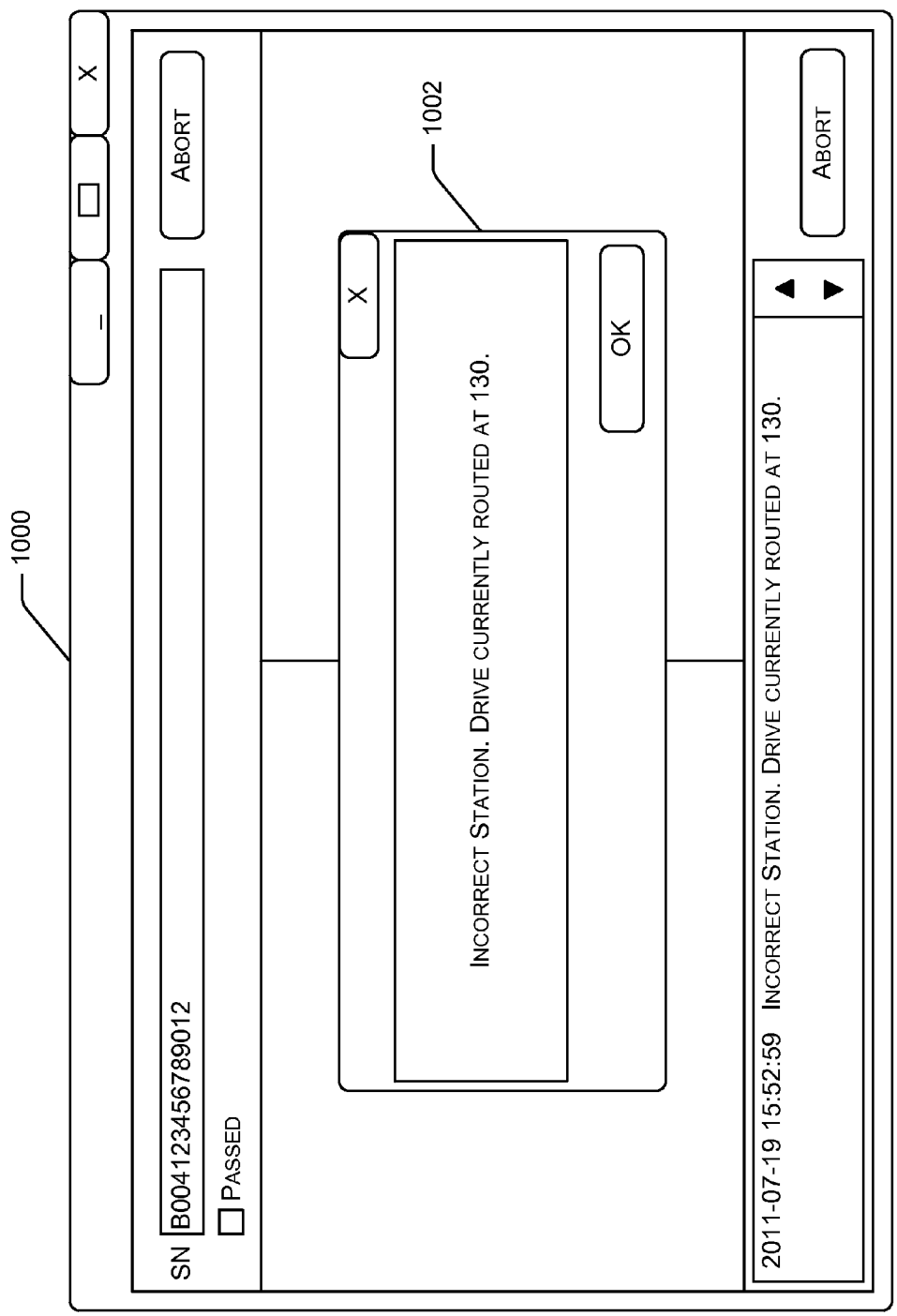
FIG. 10 depicts an illustrative diagnostic processing application user interface for providing an indication of improper deviation from a diagnostic processing route in accordance with one or more embodiments of the disclosure.

FIG. 10 depicts an illustrative diagnostic processing application user interface 1000 for providing an indication of improper deviation from a diagnostic processing route in accordance with one or more embodiments of the disclosure. Upon receipt of a device at a diagnostic station, if it is determined that the device is at an incorrect station in accordance with, for example, the illustrative method 500 depicted in FIG. 5, an indication 1002 that the device is at an incorrect station may be presented to the station operator. The station operator may then direct the device to the appropriate diagnostic station based on the diagnostic processing route associated with the device.

While embodiments of the disclosure have been described with respect to various illustrative functionality, examples and use cases, it should be appreciated that methodologies and techniques described herein are applicable to any diagnostic processing that may be performed on a returned device. Further, although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations have been described for performing diagnostic processing in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. At least one non-transitory computer-readable medium comprising computer-executable instructions that upon execution by at least one processor configure the at least one processor to perform operations comprising:
    receiving, from a reader device, device information based at least in part on data from at least one machine-readable representation associated with a device;
    determining a device identifier associated with the device using the device information;
    determining a diagnostic processing identifier based at least in part on the device identifier, wherein the diagnostic processing identifier is associated with diagnostic processing to be performed on the device, the diagnostic processing comprising one or more diagnostic tests to be performed on the device;
    determining a diagnostic processing route associated with the diagnostic processing, wherein the diagnostic processing route comprises a sequential ordering of a plurality of diagnostic stations, and wherein the device is routed during the diagnostic processing to the plurality of diagnostic stations in accordance with the sequential ordering, the plurality of diagnostic stations comprising, at least, a first station and a second station, wherein a first diagnostic test is performed at the first station and a second diagnostic test is performed at the second station;
    sending, over a network, instructions for routing the device according to the sequential ordering;
    receiving information indicative of a defect associated with the device, wherein the defect is identified at a particular diagnostic station of the plurality of diagnostic stations, the particular diagnostic station being one of the first station or the second station;
    associating a defect classification with the defect;
    determining, based at least in part on the defect classification, that the diagnostic processing is to be halted prior to the device reaching a last diagnostic station specified by the sequential ordering;
    determining that repair of the device is feasible based at least in part on the information indicative of the defect;
    generating an instruction to create a label based on the information indicative of the defect; and
    sending, over the network, the instruction to cause a label printing device to generate the label.

2. The at least one computer-readable medium of claim 1, wherein the device is a first device, the device identifier is a first device identifier, the diagnostic processing identifier is a first diagnostic processing identifier, the diagnostic processing is first diagnostic processing, the one or more diagnostic tests are a first set of one or more diagnostic tests, the defect is a first defect, and the particular diagnostic station is a first particular diagnostic station, the operations further comprising:
    determining a second device identifier associated with a second device;
    determining a second diagnostic processing identifier, wherein the second diagnostic processing identifier is associated with second diagnostic processing to be performed on the second device, the second diagnostic processing comprising a second set of one or more diagnostic tests to be performed on the second device;
    receiving information indicative of a second defect associated with the second device, wherein the second defect is identified at a second particular diagnostic station of the plurality of diagnostic stations;
    determining that the second particular diagnostic station at which the second device is located corresponds to a last diagnostic station in the sequential ordering; and
    determining that repair of the second device is feasible based at least in part on the determination that the second particular diagnostic station corresponds to the last diagnostic station in the sequential ordering.

3. The at least one computer-readable medium of claim 1, wherein the device is a first device, the device identifier is a first device identifier, the diagnostic processing identifier is a first diagnostic processing identifier, the one or more diagnostic tests are a first set of one or more diagnostic tests, the defect is a first defect, and the particular diagnostic station is a first particular diagnostic station, the operations further comprising:

determining a second device identifier associated with a second device;

determining a second diagnostic processing identifier, wherein the second diagnostic processing identifier is associated with diagnostic processing to be performed on the second device, the diagnostic processing comprising a second set of one or more diagnostic tests to be performed on the second device;

receiving information indicative of a second defect associated with the second device, wherein the second defect is identified at a second particular diagnostic station of the plurality of diagnostic stations;

determining that the second particular diagnostic station at which the second device is located does not correspond to a last diagnostic station in the sequential ordering; and sending, based at least in part on the determination that the second particular diagnostic station does not correspond to the last diagnostic station, information indicative of a next diagnostic station to which the second device is to be routed.

4. The at least one computer-readable medium of claim 1; wherein the label comprises at least one of:
   i) information indicative of the identified defect,
   ii) information indicative of the defect classification; or
   iii) information indicative of the determination that repair of the device is not feasible.

5. A method, comprising:
   receiving, from a reader device, device information based at least in part on data from at least one machine-readable representation associated with a device;
   determining, by a diagnostic system comprising one or more computers, a device identifier associated with the device using the device information,
   determining, by the diagnostic system, a diagnostic processing identifier based at least in part on the device identifier, wherein the diagnostic processing identifier is associated with diagnostic processing to be performed on the device, the diagnostic processing comprising one or more diagnostic tests to be performed on the device;
   determining, by the diagnostic system, a diagnostic processing route associated with the diagnostic processing, wherein the diagnostic processing route comprises a sequential ordering of a plurality of diagnostic stations, and wherein the device is routed during the diagnostic processing among the plurality of diagnostic stations in accordance with the sequential ordering, the plurality of diagnostic stations comprising, at least, a first station and a second station, wherein a first diagnostic test is performed at the first station and a second diagnostic test is performed at the second station;
   sending, over a network, instructions for routing the device according to the sequential ordering;
   receiving, by the diagnostic system, information indicative of a defect associated with the device, wherein the defect is identified at a first station of the plurality of diagnostic stations;
   associating, by the diagnostic system, a defect classification with the defect;
   determining, by the diagnostic system and based at least in part on the defect classification, that the diagnostic processing is to continue;
   determining, by the diagnostic system, that the first station is not a last diagnostic station in the sequential ordering;
   determining, by the diagnostic system, the second station that follows the first station in the sequential ordering, and
   sending, over the network and by the diagnostic system, an indication of the second station for display at the first station.

6. The method of claim 5, wherein at least a portion of the diagnostic processing is performed at the first station, and wherein the at least a portion of the diagnostic processing comprises at least one of: i) visual inspection of the device, ii) tactile inspection of the device, or iii) auditory inspection of the device.

7. The method of claim 5, wherein the defect classification indicates a degree of damage to the device caused by the defect.

8. The method of claim 5, wherein the defect is a first defect and the defect classification is a first defect classification, further comprising:
   receiving, by the diagnostic system, information indicative of a second defect associated with the device, wherein the second defect is identified at the second station;
   associating, by the diagnostic system, a second defect classification with the second defect;
   determining, by the diagnostic system and based at least in part on the second defect classification, that the diagnostic processing is to be halted; and
   determining, by the diagnostic system, that one or more criteria are satisfied for repairing the device,
   wherein the one or more criteria comprise at least one of: a cost of repairing the device, a capability to repair the device, or a warranty coverage associated with the device.

9. The method of claim 5, wherein the defect is a first, defect, the method further comprising:
   receiving, by the diagnostic system, an indication of a second defect identified at the second station.

10. The method of claim 9, further comprising:
    modifying, by the diagnostic system, the diagnostic processing route based at least in part on at least one of: i) the first defect identified at the first station or ii) the second defect identified at the second station.

11. The method of claim 10, wherein modifying the diagnostic processing route comprises:
    determining, by the diagnostic system, a third station that follows the second station in the sequential ordering;
    determining; by the diagnostic system, a fourth station to which the device should be routed based at least in part on at least one of the first defect or the second defect; and
    sending, by the diagnostic system for display at the second diagnostic system, an indication that the device is to be routed to the fourth station instead of the third station.

12. The method of claim 5, wherein the diagnostic processing is first diagnostic processing, the diagnostic processing identifier is a first diagnostic processing identifier, the one or more diagnostic tests are a first set of one or more diagnostic tests, and the device is a first device, the method further comprising:
    determining, by the diagnostic system, a second diagnostic processing identifier, wherein the second diagnostic processing identifier is associated with second diagnostic processing to be performed on a second device, the second diagnostic processing comprising a second set of one or more diagnostic tests to be performed on the second device;

receiving, by the diagnostic system, information indicative of one or more results of the second diagnostic processing, wherein the information indicative of one or more results of the diagnostic processing indicates that no defects associated with the device were identified during the diagnostic processing; and performing, by the diagnostic system, additional processing associated with the second device based at least in part on the information indicative of one or more results of the second diagnostic processing.

13. The method of claim 12, wherein the additional processing comprises:

generating, by the diagnostic system, instructions to generate a label indicative of success of the second diagnostic processing; and sending, by the diagnostic system, the instructions to a label generation device, wherein the label indicative of success of the second diagnostic processing comprises information identifying the second device as a refurbished device.

14. A system, comprising:

one or more computers comprising:

at least one processor; and at least one memory storing computer-executable instructions, wherein the at least one processor is configured to access the at least one memory and to execute the computer-executable instructions to:

receive, from a reader device, device information based at least in part on data from at least one machine-readable representation associated with a device;

determine a device identifier associated with the device using the device information;

determine a diagnostic processing identifier based at least in part on the device identifier, wherein the diagnostic processing identifier is associated with diagnostic processing to be performed on the device, the diagnostic processing comprising one or more diagnostic tests to be performed on the device;

determine a diagnostic processing route associated with the diagnostic processing, wherein the diagnostic processing route designates an ordering of a plurality of diagnostic stations, and wherein the device is routed during the diagnostic processing among the plurality of diagnostic stations in accordance with the ordering, the plurality of diagnostic stations comprising, at least, a first station and a second station, wherein a first diagnostic test is performed at the first station and a second diagnostic test is performed at the second station;

send, over a network, instructions for routing the device according to the sequential ordering;

determine the first station at which the device is located;

determine that the device should not have been routed to the first station based at least in part on i) the ordering designated by the diagnostic processing route and ii) at least one diagnostic test performed prior to receipt of the device at the first station;

determine an alternate station to which to route the device;

send, over the network for display at the first station, an indication of the alternate station;

receive, over the network, information indicative of an outcome of the diagnostic processing, wherein the outcome comprises one of: i) no defect being identified for the device or ii) at least one defect being identified for the device; and perform additional processing associated with the device based at least in part on the information indicative of the outcome of the diagnostic processing.

15. The system of claim 14, wherein the at least one processor is further configured to execute the computer-executable instructions to:

generate one or more reports based at least in part on the information indicative of the outcome of the diagnostic processing.

* * * * *